United States Patent [19]

Johnson et al.

[11] Patent Number: 4,507,730

[45] Date of Patent: Mar. 26, 1985

[54] MEMORY SYSTEM WITH AUTOMATIC MEMORY CONFIGURATION

[75] Inventors: Robert B. Johnson, Billerica; Chester M. Nibby, Jr., Peabody; Edward R. Salas, Billerica, all of Mass.

[73] Assignee: Honeywell Information Systems Inc., Waltham, Mass.

[21] Appl. No.: 413,631

[22] Filed: Sep. 3, 1982

Related U.S. Application Data

[63] Continuation-in-part of Ser. No. 307,542, Oct. 1, 1981, abandoned.

[51] Int. Cl.³ .............................................. G06F 13/00
[52] U.S. Cl. .................................................. 364/200
[58] Field of Search ............................. 364/200, 900

[56] References Cited

U.S. PATENT DOCUMENTS

| | | | |
|---|---|---|---|
| 3,803,560 | 4/1974 | DeVoy et al. | 364/200 |
| 4,195,342 | 3/1980 | Joyce et al. | 364/200 |
| 4,346,438 | 8/1982 | Potash et al. | 364/200 |
| 4,351,024 | 9/1982 | Bradley et al. | 364/200 |
| 4,398,248 | 8/1983 | Hsia et al. | 364/200 |

Primary Examiner—Gareth D. Shaw
Assistant Examiner—Tim A. Wiens
Attorney, Agent, or Firm—Faith F. Driscoll; Nicholas Prasinos

[57] ABSTRACT

A memory system includes a plurality of memory controllers which connect to a common bus. Each memory controller includes reconfiguration apparatus which enables the controller when faulty to be switched off line and another controller to be substituted in its place so as to maintain system memory contiguous.

46 Claims, 31 Drawing Figures

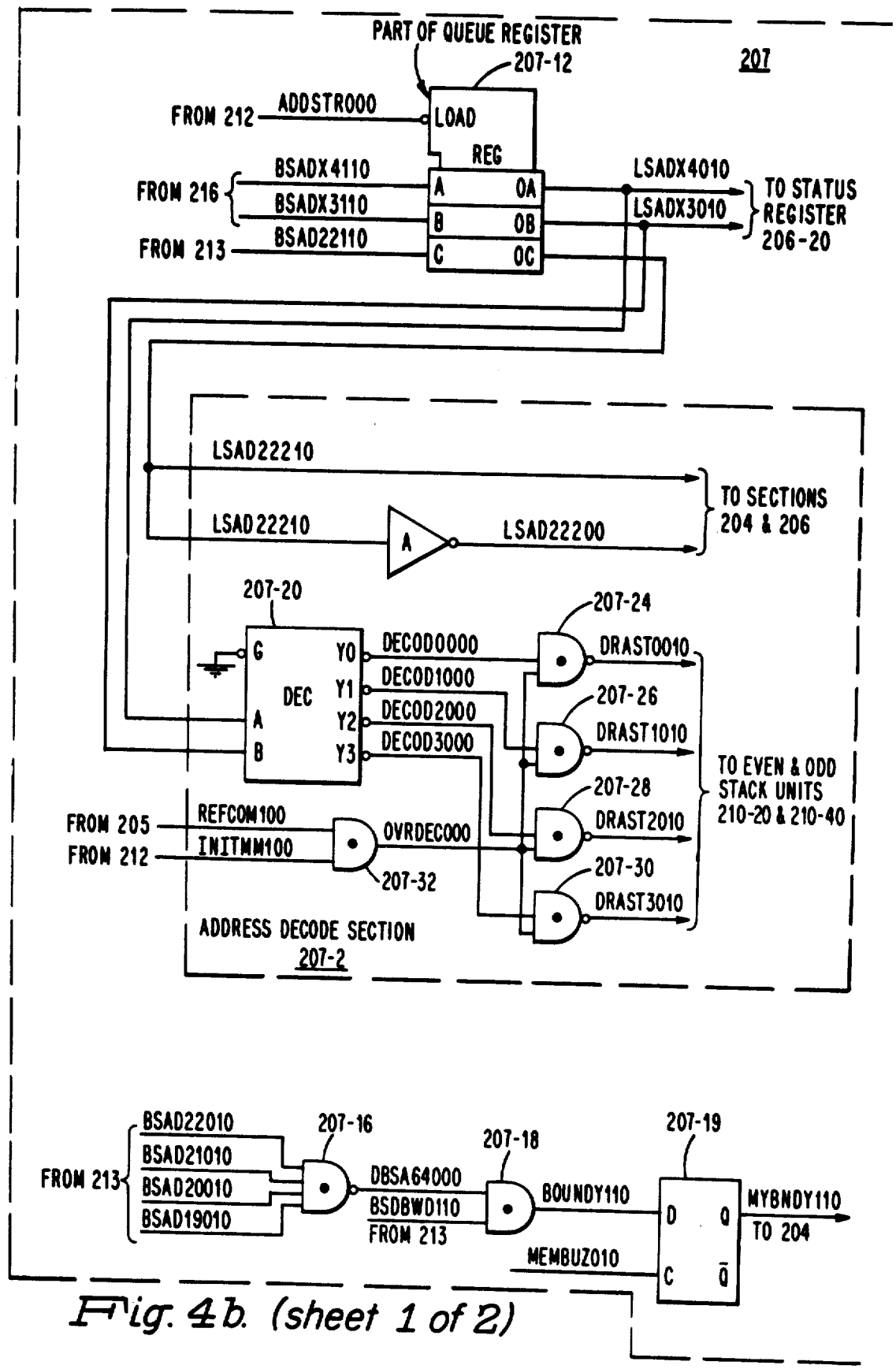
Fig. 4b. (sheet 1 of 2)

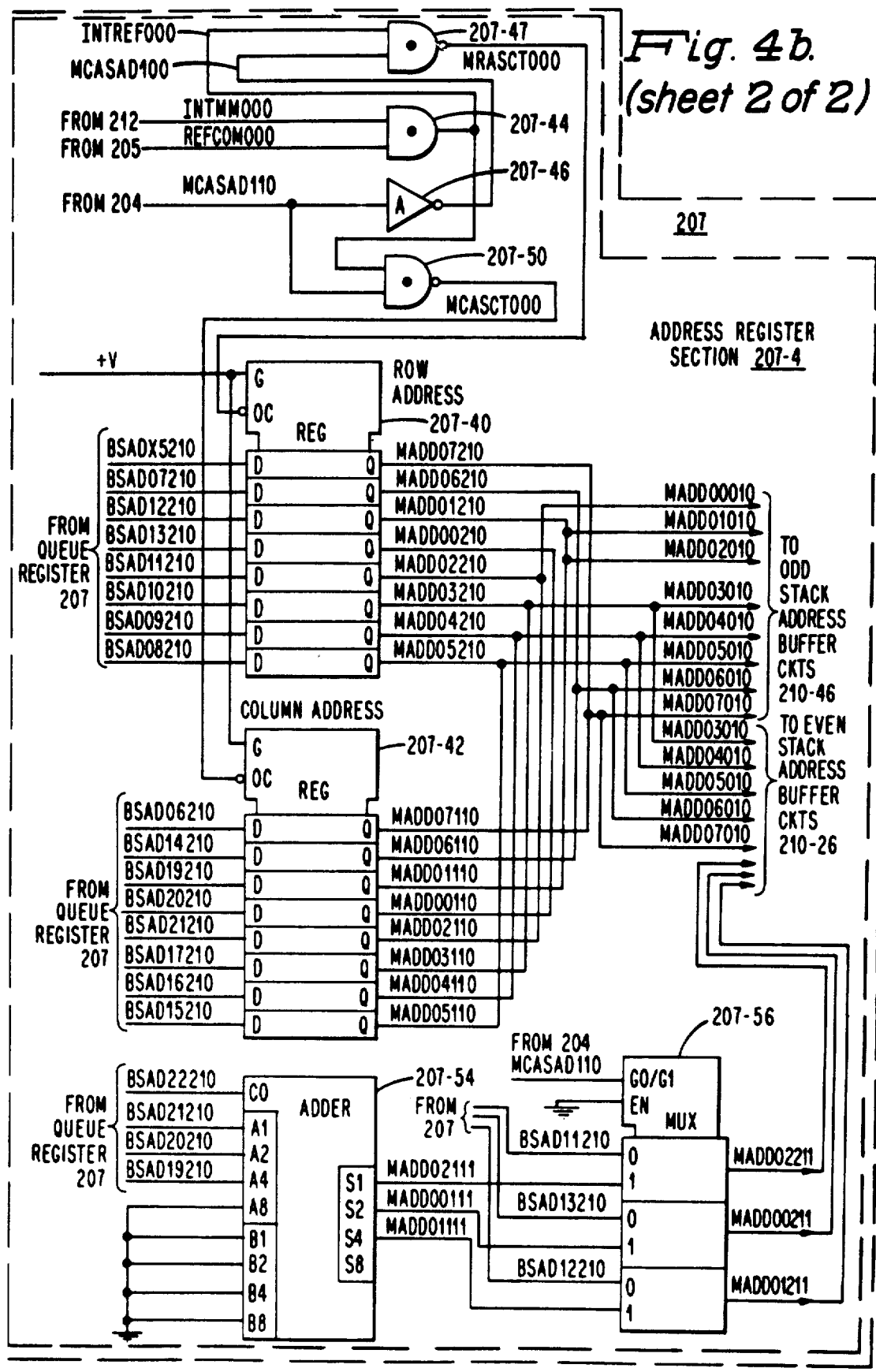
Fig. 4b. (sheet 2 of 2)

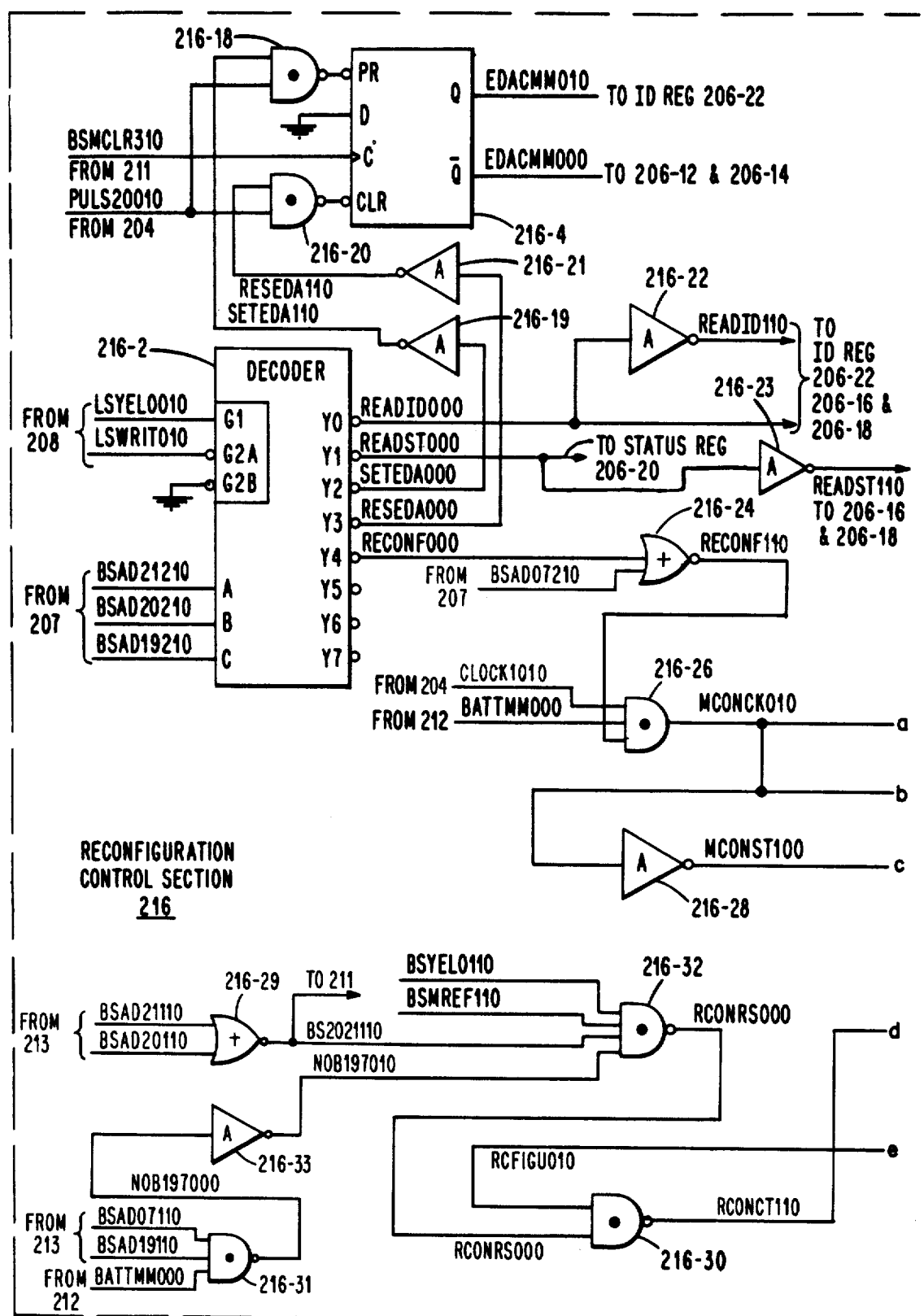
Fig. 4d. (sheet 1 of 3)

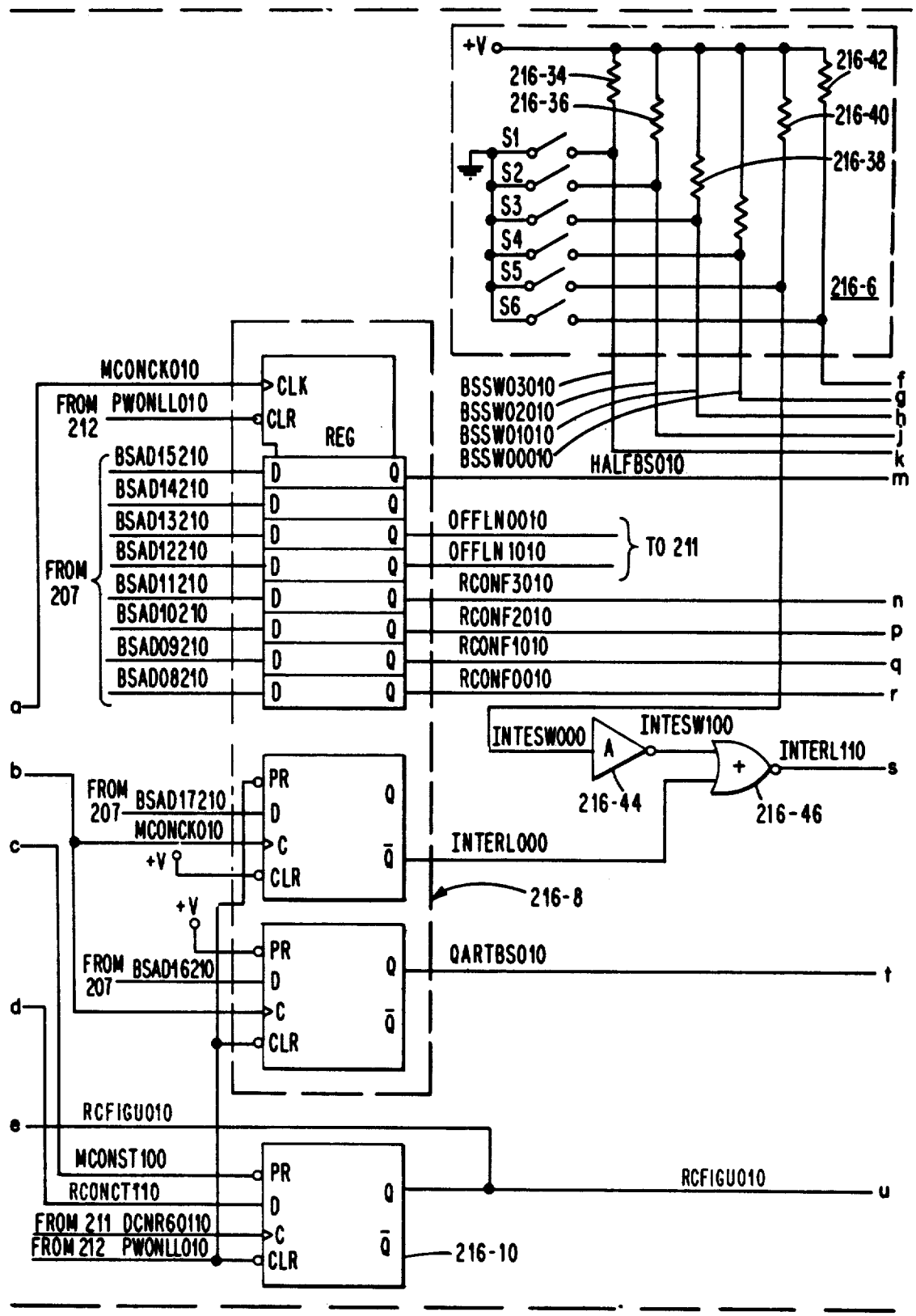
Fig. 4d. (sheet 2 of 3)

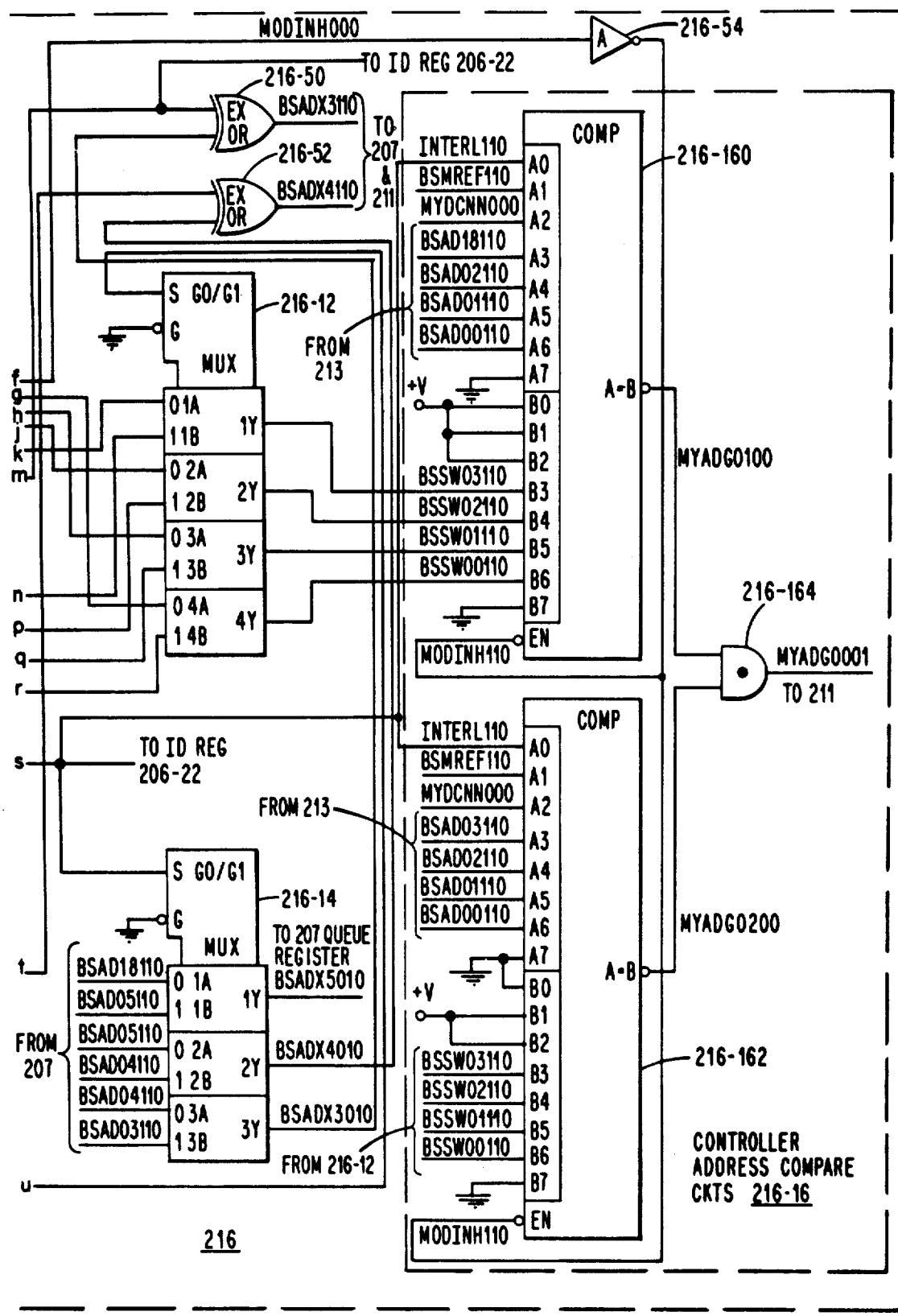
Fig. 4d. (sheet 3 of 3)

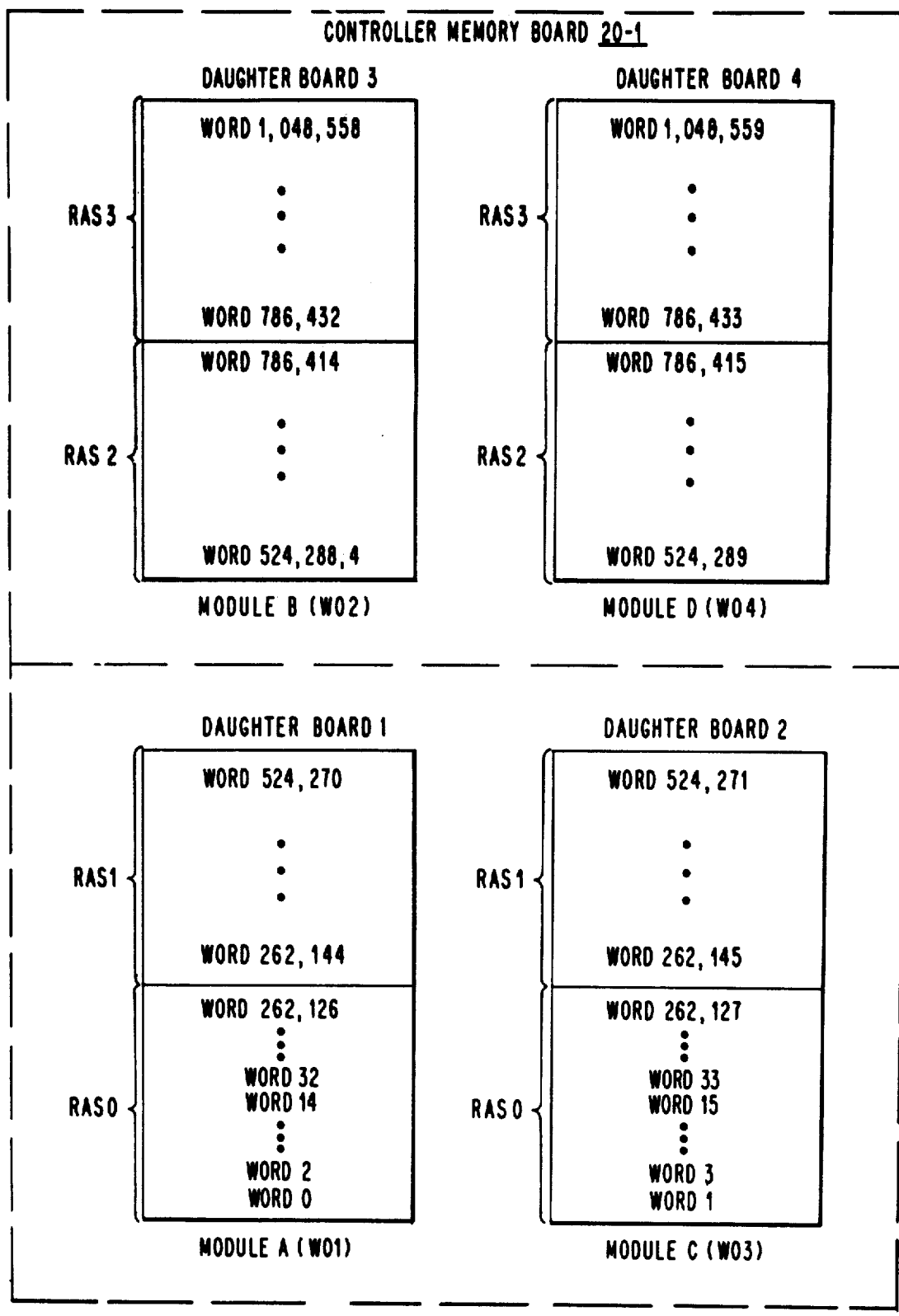
Fig. 6b. (sheet 1 of 2)

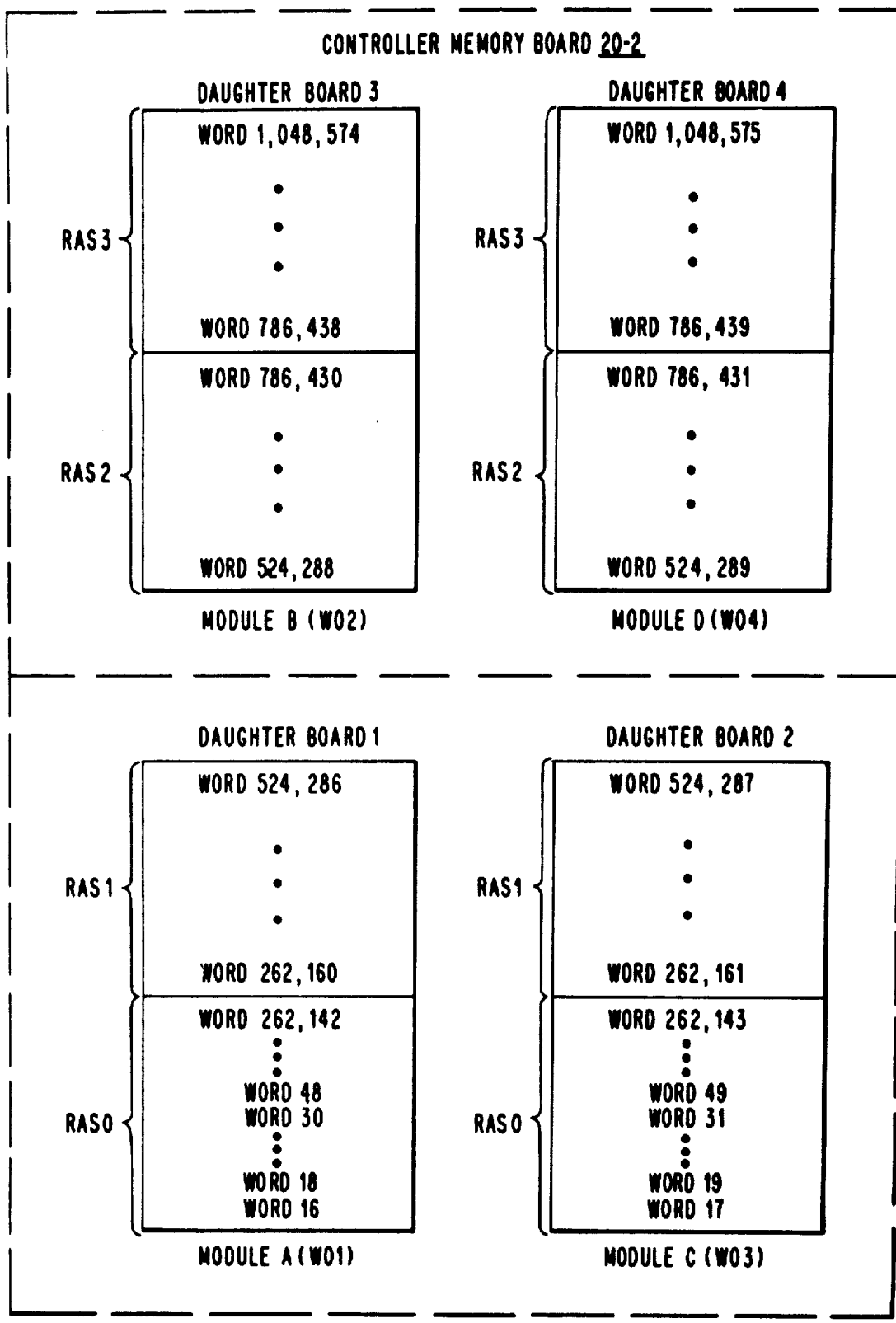
Fig. 6b. (sheet 2 of 2)

MEMORY SYSTEM WITH AUTOMATIC MEMORY CONFIGURATION

This is a continuation-in-part of co-pending patent application Ser. No. 307,542, filed on Oct. 1, 1981, now abandoned.

BACKGROUND OF THE INVENTION

The present invention relates to memory systems and more particularly to apparatus for reconfiguring a memory system as a consequence of detecting an uncorrectable error.

PRIOR ART

In general, memory systems include apparatus for reconfiguring the modules of the memory system when an error is detected. One such system is disclosed in U.S. Pat. No. 3,803,560, issued Apr. 9, 1974 to David D. Devoy and George J. Barlow. Other arrangements provide for reducing the size and capacity of a buffer store by varying key physical buffer store parameters such as mapping, replacement algorithm and buffer size. This type of system is disclosed in U.S. Pat. No. 3,820,078 which is assigned to the same assignee as named herein. Other systems such as those disclosed in British Pat. No. 1,411,290 provide for an interleaved number corresponding to the number of addresses which can be accessed in parallel which is alterable at will to enable the arrangement of memory to be freely changeable in the case of the occurrence of a fault within a memory bank.

While the above prior art systems provide for automatic memory reconfiguration, such systems reconfigure memory modules which operate under the control of a single controller or control unit by removing those modules detected as faulty. Also, such prior art systems are unable to preserve an area of memory organized in a preestablished address arrangement when an uncorrectable error has been detected within that range. This memory area, for example, corresponds to the area in which the basic operating system software of the computer is to be stored.

Accordingly, it is a primary object of the present invention to provide a memory system including more than one controller which is capable of automatically reconfigured to provide a contiguous memory space.

It is a further object of the present invention to provide a memory controller which can be automatically reconfigured to preserve a memory space system upon detection of a fault condition.

SUMMARY OF THE INVENTION

The above and other objects of the present invention are achieved in a preferred embodiment of the memory system of the present invention. The memory system includes a number of memory controllers, each of which connect to a common bus for receiving commands and data from a data processing unit. When a memory fault is detected by the data processing unit, the memory controllers are reconfigured by predetermined types of commands specifying reconfiguration. During such reconfiguration, the architecture or organization of the memory system is altered by switching the faulty controller off-line and substituting one of the other remaining good controllers in its place so as to maintain a contiguous memory space. Additionally, in the memory system of the present invention, a part of the controller's memory designated as faulty can be switched off-line and communications can be still maintained with the controller for operation of the remaining good memory as explained herein.

In the preferred embodiment of the memory system, each controller includes reconfiguration apparatus having a reconfiguration mode control register for storing a reconfiguration controller address and control information bits received from a reconfiguration command. The control bits are coded to specify the operating status of the memory controller. The reconfiguration apparatus also includes a mode control device for indicating when the controller is operating in a reconfigured mode of operation. When the mode control device is set to a predetermined state by the reconfiguration command, the controller's identity is specified by the reconfiguration address bits. That is, the controller only responds to memory commands specifying the reconfiguration controller address.

At least a pair of control information bits are used to designate the off-line status of the controller while other bits indicate the manner in which the controller has been reconfigured. In greater detail, each controller is constructed to include a mother board containing the controller's control logic circuits and a number of pairs of daughter boards, each of which contains a predetermined amount of the total amount of memory which a controller can have. In the preferred embodiment, there are two pairs of daughter boards, each daughter board containing one-fourth of the total memory.

The off-line bits are coded for indicating the number of daughter boards connected off-line. That is, these bits indicate when all of the daughter boards are connected either off-line or on-line, when one daughter board pair is connected off-line or when one-half of a daughter board pair is connected off-line.

Signals representative of the off-line bits are applied as inputs to the controller's bus response circuits. The bus response circuits are connected to receive a signal from each of the daughter boards indicating whether or not the board has been installed in the controller. In the preferred embodiment, each controller is either fully populated (i.e., includes two pairs of daughter boards) or half populated (i.e., includes one pair of daughter boards). During normal operation, the bus response circuits generate a response to a bus command as a function of whether or not the controller is fully or half populated and the states of the off-line bits. In the case of maintenance or diagnostic operations, the bus response circuits generate responses as a function of whether or not the controller is fully populated or half populated and whether or not the command specifies communication with on-line or off-line memories.

The control bits indicating how the controller has been reconfigured include at least a pair of bits. One bit is coded for designating when both pairs of daughter boards have been exchanged or swapped (i.e., half board swap). A second bit is coded for designating when sections within a pair of daughter boards have been exchanged or swapped (i.e., quarter board swap).

Additionally, the reconfiguration apparatus includes an identification register which couples to the reconfiguration register to the mode control device and bus. The register stores error status signals including signals corresponding to predetermined ones of the control information bits and the state of the mode control device.

Both the reconfiguration and identification register store indications specifying when the memory system controller is being operated in an interleaved or banked mode of operation. The memory system of the present invention is capable of being operated in either or both modes. A banked system is one where a plurality of independently accessible memory units are accessed one at a time. The memory units in the banked system are considered to be the minimum unit which is independently accessible and wherein only one address is accessible in the bank at a time. An interleaved system is one wherein the addresses are interleaved throughout the plurality of memory units so that a number of addresses can be accessed in parallel.

In accordance with the principles of the present invention, changes in the system architecture of the memory controllers are made as a function of the location of the memory fault and of the type of memory system configuration mode (i.e., banked or interleaved). For example, when the controller is fully populated and the fault occurs at a location having address 0, the controller reconfiguration apparatus can be conditioned to perform a half board and quarter board swap moving the fault to the top quarter of the controller memory.

When the memory system comprises a plurality of pairs of controllers, each operating in an interleaved mode and one controller is totally faulty, one of the remaining good controllers of the pair assigned the highest memory space can be exchanged with the bad controller which is then placed off-line. In such an arrangement, the remaining good controller of the pair can be operated in banked mode.

From the above, it can be seen that notwithstanding the type of system configuration, the invention enables automatic reconfiguration of memory controllers so as to provide a contiguous memory space and preserve certain memory space required for system operation (i.e., operating system software memory area).

The novel features which are believed to be characteristic of the invention both as to its organization and method of operation, together with further objects and advantages will be better understood from the following description when considered in connection with the accompanying drawings. It is to be expressly understood, however, that each of the drawings are given for the purpose of illustration and description only and are not intended as a definition of the limits of the present invention.

BRIEF DESCRIPTION OF THE DRAWINGS

FIGS. 4a through 4e illustrate in greater detail different portions of the memory subsystem 20-1 of FIG. 3.

FIG. 6b illustrates the memory organizations of a pair of controllers of FIG. 1.

GENERAL DESCRIPTION OF SYSTEM OF FIG. 1

Figure 1:
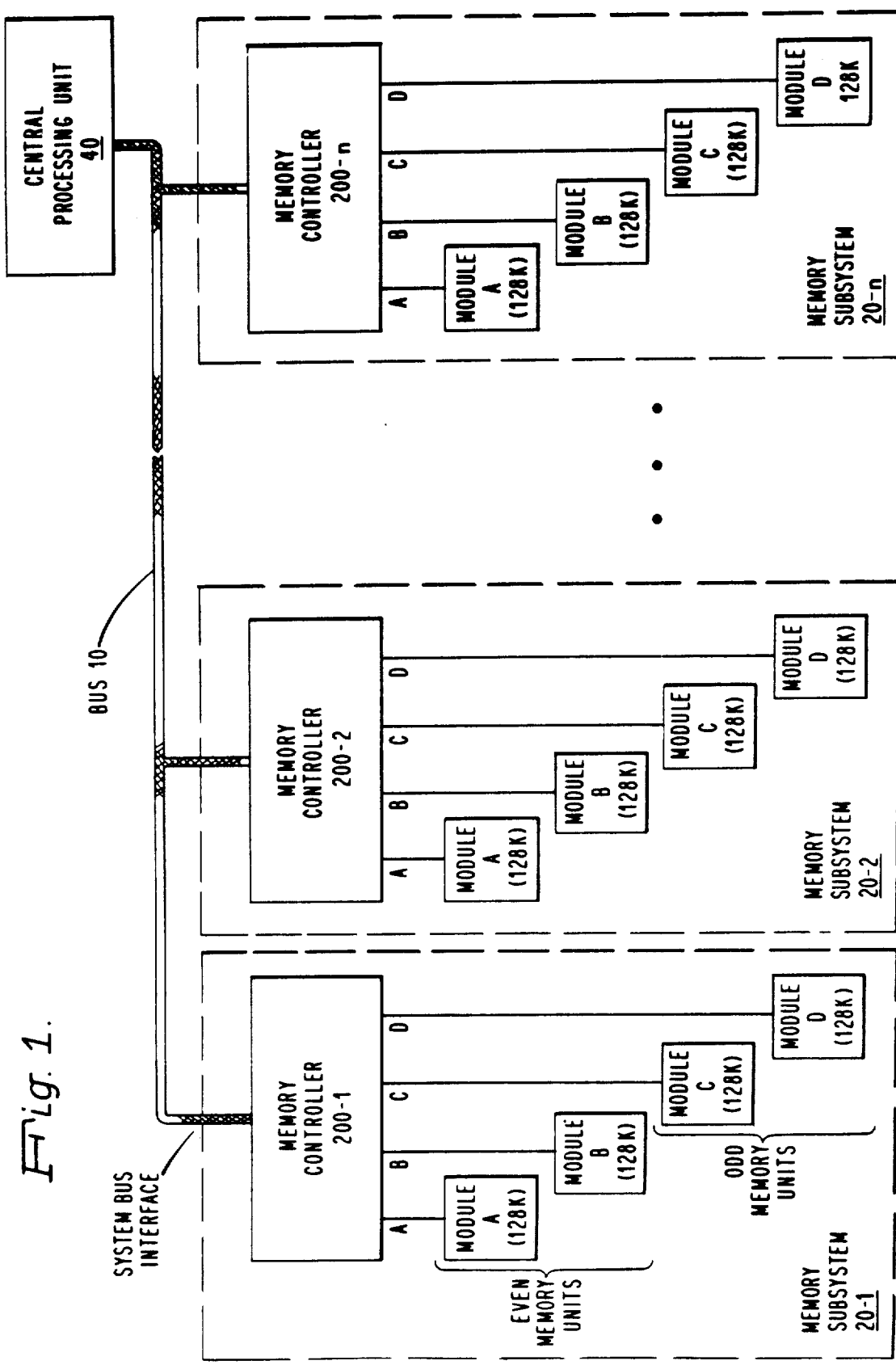
FIG. 1 shows in block diagram form a system which includes a memory system of the present invention.

FIG. 1 illustrates a data processing system which includes the apparatus of the present invention. Referring to FIG. 1, it is seen that the system includes a multiline bus 10 coupled to n number of memory subsystems 20-1 through 20-n and to a central processing unit (CPU) 40. While only memory controllers are shown, it will be appreciated that the system of FIG. 1 will normally include other units such as those disclosed in U.S. Pat. No. 4,000,485 issued Dec. 28, 1976. Each of the memory subsystems include a memory controller (i.e., 200-1 through 200-n) which address up to two pairs or four memory module units labeled A through D. As discussed herein, the circuits of each memory module unit is included on a daughter board which connects to a mother board containing the controller's control circuits. In the preferred embodiment, a memory controller is either fully populated (i.e., contains two pairs of daughter boards) or is half populated (i.e., contains one pair of daughter boards).

The CPU 40 is a microprogrammed processing unit which may for the purposes of the present invention may be considered conventional in design. The patent application "System Providing Multiple Outstanding Information Requests", invented by Richard A. Lemay and John L. Curley, Ser. No. 867,266, filed Jan. 5, 1978 and assigned to the same assignee as named herein may be consulted for further details. Also, the related patent application of George J. Barlow, et al., titled "Interface for Controlling Information Transfers between Main Data Processing Systems Units and a Central Subsystem" referenced herein may also be consulted.

Figure 2:
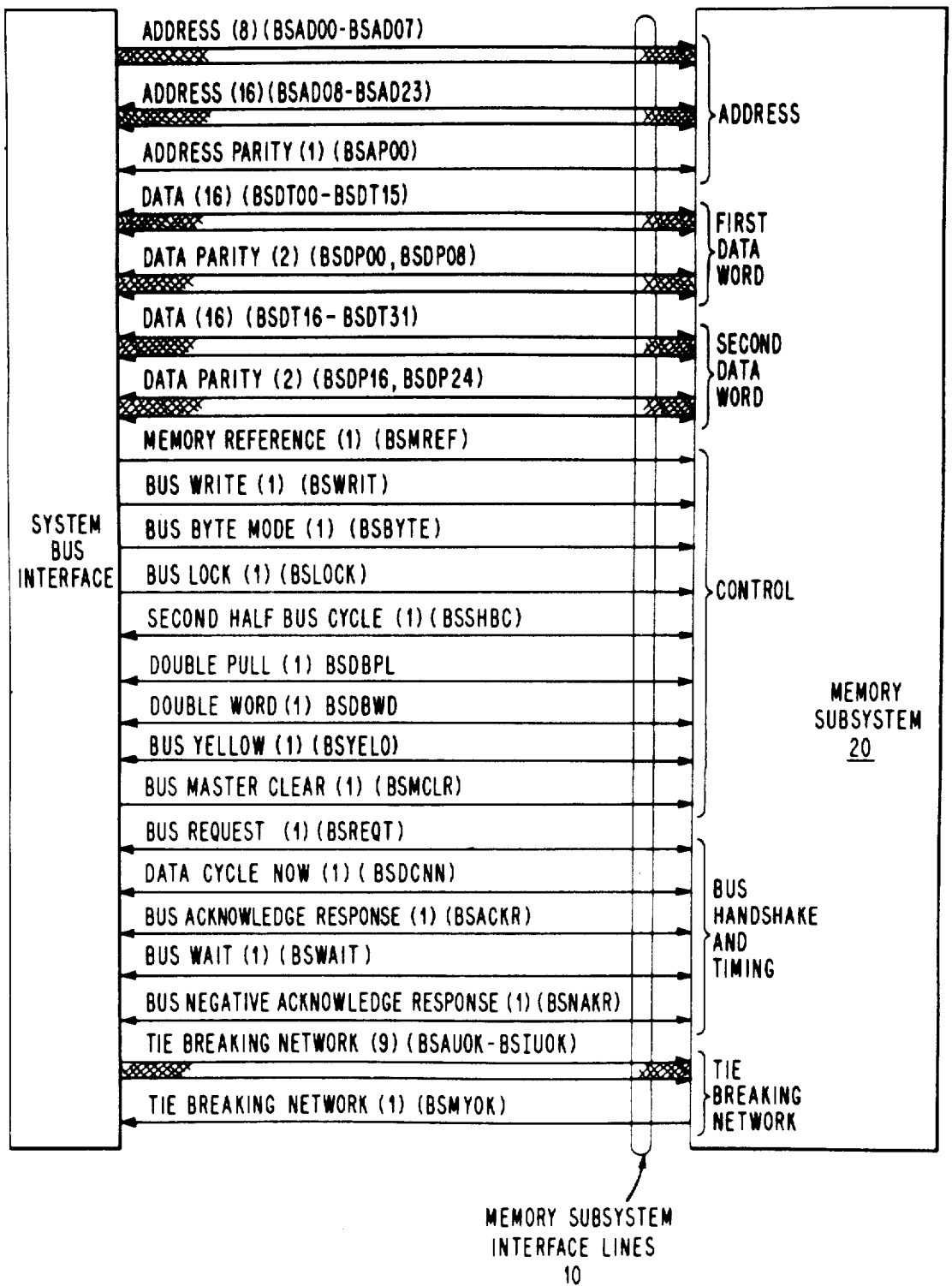
FIG. 2 shows in detail the lines of the system bus 10 which connect to each of the memory subsystems of FIG. 1.

The CPU 40 as well as each controller and each memory subsystem communicates over the bus 10 in a predetermined manner as set forth in U.S. Pat. No. 4,000,485. Briefly, a unit wishing to communicate requests a bus cycle and when the bus cycle is granted, the unit becomes the "master" and is able to address any other unit in the system as the "slave". In the cases of those bus exchanges which require a response (e.g. memory read operation), the requesting unit as "master" identifies itself and indicates to the "slave" unit that a response is required. When the slave is ready to respond (e.g. obtains the information requested), it assumes the role of "master" and initiates the transfer of information to the requesting unit. Thus, the number of bus cycles vary depending upon the type of operation being performed. By altering the states of the signals applied to the control lines discussed in connection with FIG. 2, a unit is able to designate to the other unit, the type of cycle of operation being initiated or performed.

A distributed tie-breaking network grants bus cycles and resolves simultaneous requests for use of bus 10. Priority is granted on the basis of physical position on bus 10, the highest priority being given to the first unit on the bus. In a typical system, the memory subsystem is granted the highest priority and the CPU is granted the lowest priority with the other units being positioned on the basis of their performance requirements.

MEMORY SUBSYSTEM INTERFACE

Before describing the controller of FIG. 1, it is seen that there are a number of lines which constitute the interface between each controller and bus 10. As shown, the interface lines include a number of address lines (BSAD00-23, BSAP00), two sets of data lines (BSDT00-15, BSDP00, BSDP08) and (BSDT16-31, BSDP16, BSDP24), a number of control lines (BSMREF-BSMCLR), a number of timing lines (BSREQT-BSNAKR), and a number of tie breaking network lines (BSAUOK-BSIUOK, BSMYOK).

The description of the above interface lines are given in greater detail in the section to follow.

| MEMORY SUBSYSTEM INTERFACE LINES | |
|---|---|
| Designation | Description |
| | Address Lines |
| BSAD00-BSAD23 | The bus address lines constitute a twenty-four bit wide path used in conjunction with the bus memory reference line BSMREF to transfer a 24-bit address to controller 200 or a 16-bit identifier from controller 200 to the bus (for receipt by a slave unit). When used for memory addressing, the signals applied to lines BSAD00-BSAD03 select a particular 512K word module, the signals applied to lines BSAD04-BSAD22 select one of the 512K words in the module while the signal applied to line BSAD23 selects one of the bytes within the selected word (i.e., BSAD23 = 1 = right byte; BSAD23 = 0 = left byte). When used for identification, lines BSAD00-BSAD07 are not used. The lines BSAD08-BSAD23 carry the identification of the receiving unit as transmitted to controller 200 during the previous memory read request. |
| BSAP00 | The bus address parity line is a bidirectional line which provides an odd parity signal for the address signals applied to lines BSAD00-BSAD07. |
| | Data Lines |
| BSDT00-BSDT15, BSDT16-BSDT31 | The sets of bus data lines constitute a 32-bit or two word wide bidirectional path for transferring data or identification information between controller 200 and the bus as a function of the cycle of operation being performed. During a write cycle of operation, the bus data lines transfer information to be written into memory at the location specified by the address signals applied to lines BSAD00-BSAD23. During the first half of a read cycle of operation, the data lines BSDT00-BSDT15 transfer identification information (channel number) to the controller 200. During the second half of the read cycle, the data lines transfer the information read from memory. |
| BSDP00, BSDP08, BSDP16, BSDP24 | The bus data parity lines are two sets of bidirectional lines which provide odd parity signals coded as follows: BSDP00=odd parity for signals applied to lines BSDT00-BSDT07 (left byte); BSDP08=odd parity for signals applied to lines BSDT08-BSDT15 (right byte); BSDP16=odd parity for signals applied to lines BSDT16-BSDT23; and BSDP24=odd parity signals applied to lines BSDT24-BSDT31. |
| | Control Lines |
| BSMREF | The bus memory reference line extends from the bus to the memory controller 200. When set to a true state, this line signals the controller 200 that the lines BSAD00-BSAD23 contain a complete memory controller address and that it is performing a write or read operation upon the specified location. When reset to a false state, the line signals controller 200 that the lines BSAD00-BSAD23 contain information directed to another unit and not controller 200. |
| BSWRIT | The bus write line extends from the bus to the memory controller 200. This line when set to a true state, in conjunction with line BSMREF being true, signals controller 200 to perform a write cycle of operation. When reset to a false state, this line, in conjunction with line BSMREF being true, signals controller 200 to perform a read cycle of operation. |
| BSBYTE | The bus byte line extends from the bus to controller 200. This line, when set to a true state, signals controller 200 that it is to perform a byte operation rather than a word operation. |
| BSLOCK | The bus lock line extends from the bus to controller 200. When set to a true state, this line signals controller 200 of a request to perform a test or change the status of a memory lock flip-flop included within the controller 200. |
| BSSHBC | The bus second half bus cycle line is used to signal a unit that the current information applied to the bus by controller 200 is the information requested by a previous read request. In this case, both controller 200 and the unit receiving the information are busy to all units from the start of the initiation cycle until controller 200 completes the transfer. This line is used in conjunction with the BSLOCK line to set or reset its memory lock flip-flop. When a unit is requesting to read or write and line BSLOCK is true, the line BSSHBC, when true, signals controller 200 to reset its lock flip-flop. When in a false state, it signals controller 200 to test and set its lock flip-flop. |
| BSMCLR | The bus master clear line extends from the bus to controller 200. When this line is set to a true state, it causes the controller 200 to clear to zeros certain bus circuits within controller 200. |
| BSDBWD | The double word line is a unidirectional line which extends from the controller 200 to bus 10. This line together with the BSDBPL line is used during read requests to indicate how many words of data and in what format are being provided by memory controller 200. During read response cycles from memory controller 200, the state of line BSDBWD indicates whether one or two words of data are being applied |

-continued
MEMORY SUBSYSTEM INTERFACE LINES

| Designation | Description |
|---|---|
| | to bus 10. When line BSDBWD is forced to a binary ONE state, this indicates that two words are being transferred. When only one word is being transferred, line BSDBWD is forced to a binary ZERO. |
| BSDBPL | The double pull line is a bidirectional line which extends between controller 200 and bus 10. This line together with line BSDBWB indicates whether the response is the first (not the last) or the last unit of data requested. |
| | Bus Handshake/Timing Lines |
| BSREQT | The bus request line is a bidirectional line which extends between the bus and controller 200. When set to a true state, it signals the controller 200 that another unit is requesting a bus cycle. When reset to a false state, it signals controller 200 that there is no bus pending bus request. This line is forced to a true state by controller 200 to request a read second half bus cycle. |
| BSDCNN | The data cycle line is a bidirectional line which extends between the bus and controller 200. When forced to a true state, the line signals the controller 200 that a unit was granted a requested bus cycle and placed information on the bus for another unit. The controller 200 forces the line to a true state to signal that it is transmitting requested data back to a unit. Prior to this, controller 200 had requested and been granted a bus cycle. |
| BSACKR | The bus acknowledge line is a bidirectional line which extends between the bus and controller 200. When set to a binary ONE by controller 200, the line signals that it is accepting a bus transfer during a read first half bus cycle or write cycle. During a read second half bus cycle, this line when set to a binary ONE by the unit which originated the request signals the controller 200 of its acceptance of a transfer. |
| BSWAIT | The bus wait line is a bidirectional line which extends between the bus and controller 200. When set to a true or binary ONE state by controller 200, it signals a requesting unit that the controller cannot accept a transfer at this time. Thereafter, the unit will initiate successive retries until the controller 200 acknowledges the transfer. The controller 200 sets the BSWAIT line true under the following conditions: <br> 1. It is busy when all queue registers are full. <br> 2. It is busy when placed in an initialize mode. <br> When the BSWAIT line is set to a true or binary ONE state by a unit, this signals the controller 200 that the data is not being accepted by the requesting unit and to terminate its present bus cycle of operation. |
| BSNAKR | The bus negative acknowledge line is a bidirectional line which extends between the bus and controller 200. When this line is set to a true or binary ONE state by controller 200, it signals that is is refusing a specified transfer. The controller 200 sets line BSNAKR to a true state as follows: <br> 1. Memory lock flip-flop is set to a binary ONE, and <br> 2. The request is to test and set the lock flip-flop (BSLOCK true and BSSHBC false). <br> In all other cases, when the memory lock flip-flop is set, controller 200 generates a response via the BSACKR line or the BSWAIT line or generates no response. <br> When the BSNAKR line is forced true by a unit, this signals controller 200 that the data is not accepted by the unit and to terminate its cycle of operation. |
| | Tie Breaking Control Lines |
| BSAUOK-BSIUOK | The tie breaking network lines extend from the bus to controller 200. These lines signal controller 200 whether units of higher priority have made bus requests. When all the signals on these lines are binary ONES, this signals controller 200 that it has been granted a bus cycle at which time it is able to force the BSDCNN line to a binary ONE. When any one of the signals on the lines is a binary ZERO, this signals controller 200 that it has not been granted a bus cycle and is inhibited from forcing line BSDCNN to a binary ONE. |
| BSMYOK | The tie breaking network line extends from controller 200 to the bus. Controller 200 forces this line to a false or binary ZERO state to signal other units of lower priority of a bus request. |
| BSYELO | The bus yellow line is a bidirectional line. When set to a true state during the second half of a bus cycle in response to a read command, it indicates that the accompanied transferred information has been successfully corrected. When set to a true state during a memory read request, this line indicates that the read request is to be interpreted as a diagnostic command. |

GENERAL DESCRIPTION OF THE MEMORY SUBSYSTEM OF FIG. 1

Figure 3:
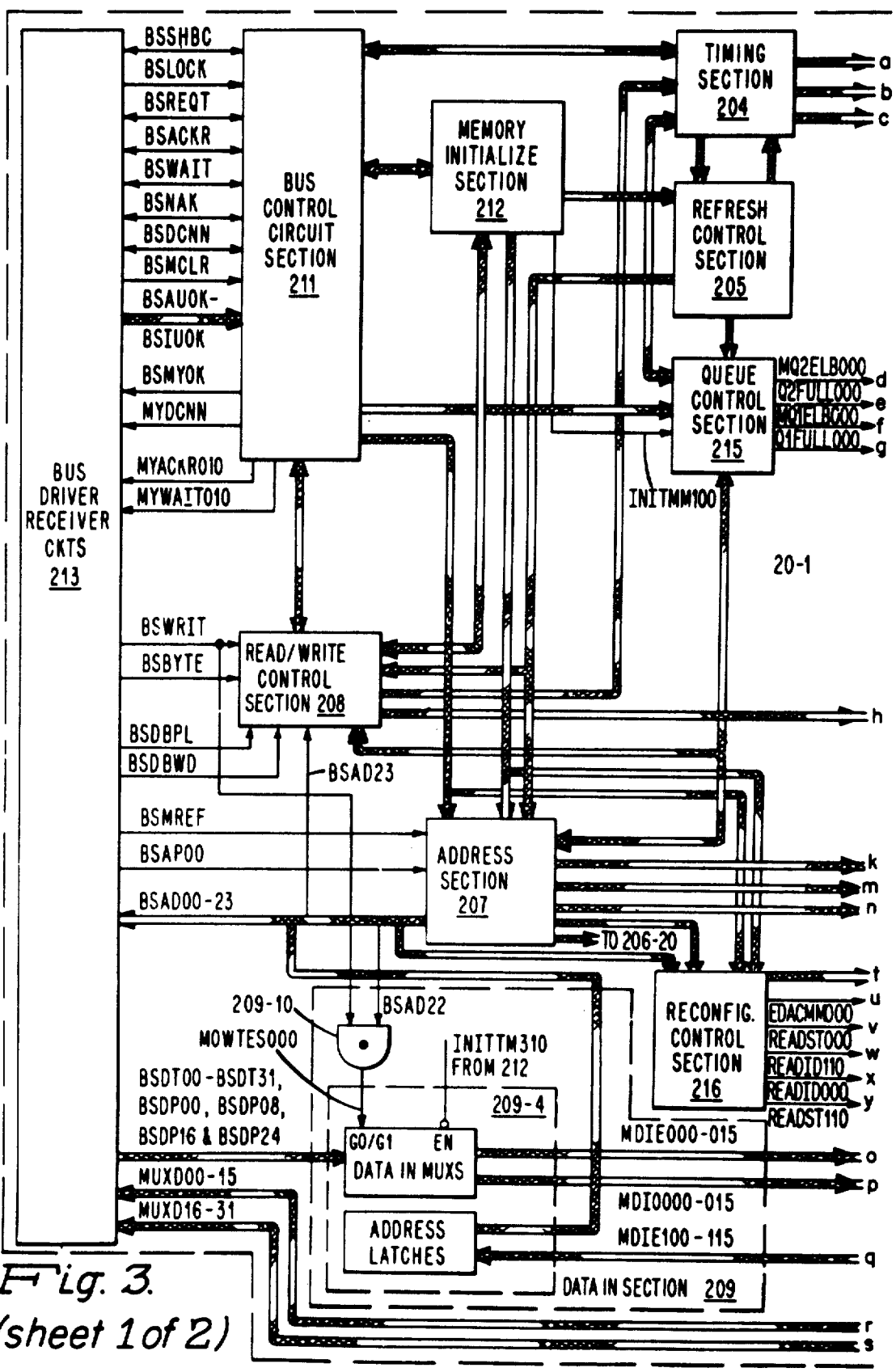
FIG. 3 shows in block diagram form, the memory subsystem 20-1 of FIG. 1.

FIG. 3 shows a preferred embodiment of a memory subsystem 20-1 including a controller 200-1 which is constructed using the principles of the present invention. Referring to FIG. 1, it is seen that the controller 200-1 controls the two 256K word memory module units 210-2 and 210-4 of memory section 210. The module units of blocks 210-2 and 210-4 include high speed MOS random access memory integrated circuits corresponding to blocks 210-20 and 210-40, and address buffer circuits corresponding to blocks 210-22 through 210-26 and 210-42 through 210-46. Each 256K memory unit is constructed from 64K word by 1-bit dynamic MOS RAM chips illustrated in greater detail in FIG. 4c. More specifically, referring to FIG. 4c, it is seen that each 256K by 22-bit memory module includes 88, 65,534 (64K) word by 1-bit chips. Within each chip there are a number of storage arrays organized in a matrix of 256 rows by 256 columns of storage cells.

The controller 200-1 includes those circuits required to generate memory timing signals, perform refresh operations, control operations, data transfer operations, address distribution and decoding operations and bus interface operations. Such circuits are included as part of the different sections of FIG. 3.

The sections include a timing section 204, a refresh control section 205, a data control section 206, an address section 207, a read/write control section 208, a data in section 209, a bus control circuit section 211, a memory initialize circuit section 212, a bus driver/receiver circuit section 213 and a reconfiguration control section 216.

The bus control section 211 includes the logic circuits which generate signals for generating and accepting bus cycle requests for single and double word operations. As seen from FIG. 3, these circuits as well as the circuits of the other sections are connected to the bus via the driver/receiver circuits of section 213 which are conventional in design. The section 211 includes the tie breaking network circuits which resolve request priority on the basis of a unit's physical position on the bus. The memory controller 200-1 of FIG. 1, located at the left most or bottom position of bus 10, is assigned the highest priority while a central processing unit (CPU) 40, located at the highest most or top position of the bus is assined the lowest priority. For further information regarding bus operation, reference may be made to U.S. Pat. No. 4,000,485 which issued Dec. 28, 1976.

Figure 4A:
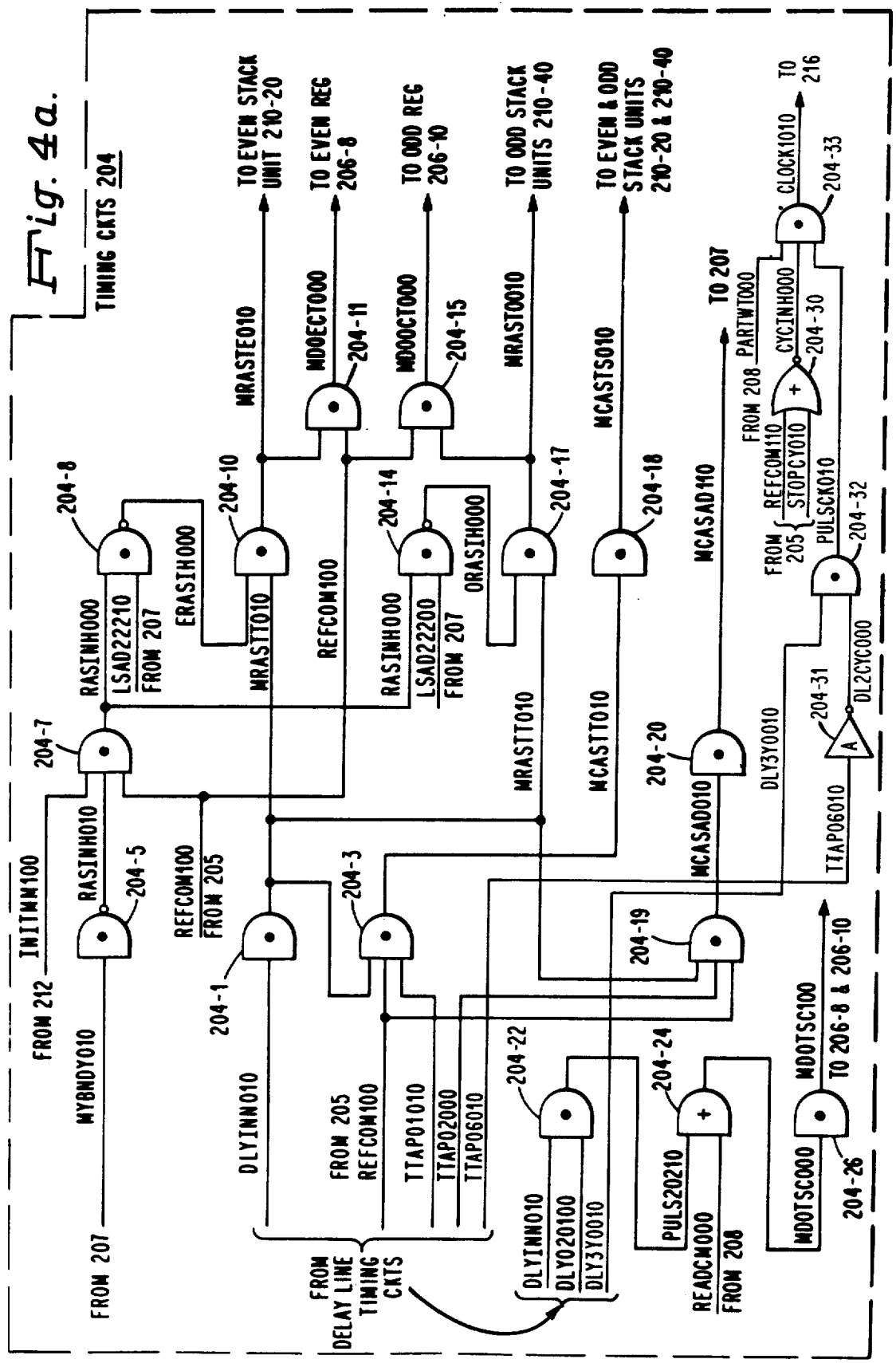

The timing section 204, shown in detail in FIG. 4a, includes circuits which generate the required sequence of timing signals from memory read and write cycles of operation. As seen from FIG. 3, this section transmits and/or receives signals to and from sections 205, 206, 207, 208, 211, 213 and 215.

The address section 207, shown in greater detail in FIG. 4b, includes circuits which decode, generate and distribute address signals required for refresh operations, initialization and read/write selection. The section 207 receives address signals from lines BSAD00-BSAD23 and BSAP00 in addition to the memory reference control signal from the BSMREF line. Additionally, section 207 receives control and timing signals from sections 204, 205, 212 and 215.

The memory initialization section 212 includes circuits, conventional in design, for clearing the controller circuits to initial or predetermined state.

The read/write control section 208 includes register and control logic circuits, conventional in design. The register circuits receive and store signals corresponding to the states of the BSWRIT, BSBYTE, BSDBPL, BSDBWD and BSAD23 lines. The control circuits decode the signals from the register circuits and generate signals which are applied to sections 204, 207 and 210 for establishing whether the controller is to perform the read, write or read followed by a write cycle of operation (i.e., for a byte command).

The refresh section 205 includes the circuits for periodically refreshing the contents of the memory. Section 205 receives timing and control signals from section 204 and provides refresh command control signals to sections 204, 207, 208, and 212. For further details, reference may be made to U.S. Pat. No. 4,185,323 which discloses circuits for generating refresh command (REFCOM) signals.

The data in section 209 circuits of block 209-4 include a pair of multiplexer circuits and an address register which is connected to receive signals from section 206.

The multiplexer circuits, conventional in design, receive data words from the two sets of bus lines BSDT00-15 and BSDT16-31 and apply the appropriate words via the sets of output lines MDIE000-015 and MDIO000-015 to the correct memory modules during a write cycle of operation. That is, multiplexer circuits are selectively enabled by signal MOWTES000 generated by an AND gate 209-10 when initialize signal INITTM310 from 212 is a binary ZERO (i.e., not in an initialize mode). The AND gate 209-10 generates signal MOWTES000 as a function of bus address bit 22 (i.e., signal BSAD22) and whether the controller is doing a write operation (i.e., signal BSWRIT). During a write operation, signal MOWTES000 selects the correct data word (i.e., the word applied to bus lines BSDT00-15 or BSDT16-31) to be applied to the correct memory unit. This enables a write operation to start on any word boundary.

During a read operation, the multiplexer circuits are conditioned to apply the module identification information received from the bus lines BSDT00-15 back to the address bus lines BSAD08-23. This is done by loading the signals applied to lines BSDT00-15 into the even data registers 206-8 of section 206. This, in turn, causes the address register latches of block 209-4 to be with the module identification information transmitted via the bus lines BSDT00-15. Since this is not pertinent to an understanding of the present invention, it will not be further discussed herein.

The data control section 206 includes two sets of tristate operated data registers 206-8 and 206-10, multiplexer circuits 206-16 and 206-18 with associated control circuits which enable data to be written into and/or read from the even and odd memory units 210-20 and 210-40 of section 210. For example, during a double wide read cycle of operation, operand or instruction signals are read out from the units 210-20 and 210-40 into the even and odd output registers 206-8 and 206-10. During a write cycle of operation, signals MDIE000-15 and MDIO000-15 are loaded into the left most section of the pair of registers 206-8 and 206-10 from the bus via section 209-4 and written into the odd or even unit of section 210.

In accordance with the teachings of the present invention, section 206 further includes a status register 206-20 and an identification register 206-22. The status register 206-20 is connected to store memory error information used for isolating memory faults. For example, the register stores combinations of address bits from section 207 and EDAC syndrome bits from EDAC circuits 206-12 and 206-14 required for isolation of faults down to the RAM chip in the case of correctable single bit errors. The status register 206-20 contains status information pertaining to the most recent single bit error and its contents remain frozen in the case of uncorrectable double bit errors.

The identification register 206-22 is connected to store signals received from reconfiguration control section 216 identifying the type of reconfiguration and mode of operation. Additionally, section 206 includes the red and yellow generator circuits of block 206-24. These circuits generate signals indicating whether the information being transferred to bus 10 is in error and whether or not the error is correctable. The yellow generator circuits force a signal applied to line BSYELO to a binary ONE for indicating that the accompanying transferred information is correct but that a correction operation was performed (i.e., a hard or soft error condition). The red generator circuits force another signal to a binary ONE for indicating that the accompanying transferred information is in error (i.e., an uncorrectable error condition). These signals are applied to other bus lines, not shown. For further details concerning the generation of these signals, reference may be made to U.S. Pat. No. 4,072,853.

The controller 200-1 includes error detection and correction (EDAC) apparatus wherein each word contains 16 data bits and 6 check bits used to detect and correct single bit errors in the data words and detect and signal without correction, double bit errors in the data word. The EDAC apparatus includes two sets of EDAC encoder/decoder circuits 206-12 and 206-14. These circuits may take the form of those circuits disclosed in U.S. Pat. No. 4,072,853 which issued Feb. 7, 1978. Additionally, the section 206 enables a return of identification information received from the data lines BSDT00-15 and stored in register 209-4 via the address lines BSAD08-23.

For completeness, queue control section 215 has also been included as part of controller 200-1. This section includes circuits for storing address and control information for concurrently processing a plurality of memory requests. As seen from FIG. 3, section 215 receives control signals from sections 204, 205, 207, 211 and 212. The section provides control signals to sections 204, 206, 207 and 208, as shown. Since the operation of this section is not pertinent to an understanding of the present invention, it will not be disclosed in greater detail herein.

In accordance with the teachings of the present invention, reconfiguration control section 216 includes circuits for enabling controller reconfiguration. As seen from FIG. 3, section 216 receives address and control signals from sections 207, 208, 211 and 212. Section 216 provides control and status signals to sections 206, 207 and 211.

Pertinent portions of the above sections will now be discussed in greater detail with reference to FIGS. 4a through 4c.

DETAILED DESCRIPTION OF CONTROLLER SECTIONS

Only those sections which are believed necessary to an understanding of the present invention are described herein. For further information regarding the remaining sections, reference may be made to U.S. Pat. No. 4,185,323.

SECTION 204 AND SECTION 206

FIG. 4a illustrates in greater detail, the timing circuits of section 204. The circuits receive input timing pulse signals DLYINN010, TTAP01010 and TTAP02010 from delay line timing generator circuits, not shown, conventional in design. Such circuits may take the form of the timing generator circuits shown in U.S. Pat. No. 4,185,323. The timing generator circuits generate a series of timing pulses via a pair of series connected 200 nanosecond delay lines in response to the signal MYACKR010 being switched to a binary ONE. These pulses in conjunction with the circuits of block 204 establish the Timing for the remaining sections during a memory cycle of operation.

Additionally, the circuits of block 204 receive a boundary signal MYBNDY010 and address signals LSAD22200 and LSAD22210 from section 207. Also, section 212 applies an initialize signal INITMM100 to section 204. The signal MYBNDY010 is applied to NOR gate 204-5 which forces signal RASINH010 to a binary ZERO when forced to a binary ONE. The series connected AND gate 204-7 logically combines initialize signal INITMM100, refresh command signal REFCOM100 generated by circuits within section 205, not shown, to produce signal RASINH000. A NAND gate 204-8 combines signals RASINH000 and address signal LSAD22210 to produce an even row strobe inhibit signal ERASIH000. The signal is applied to an AND gate 204-10 for combining with a timing signal MRASTT010 derived from signal DLYINN010 via an AND gate 204-1. The result output signal MRASTE010 is applied to the RAS timing input of the even stack units 210-20.

A NAND gate 204-14 combines signals RASINH010 and LSAD22200 to produce an odd row inhibit signal ORASIH000. This signal is combined in an AND gate 204-17 with timing signal MRASTT010 to generate row timing signal MRAST0010. This signal is applied to the RAS timing input of the odd stack units 210-40.

As seen from FIG. 4a, an AND gate 204-11 applies a timing signal MDOECT000 to a G input terminal of the middle section of even data register 206-8 in the absence of a refresh command (i.e., signal REFCOM000=1). Similarly, an AND gate 204-15 applies a timing signal MDOOCT000 to a G input terminal of the middle section of odd data register 206-10. AND gate 204-3 combines signals MRASTT010, REFCOM100 and TTAP01010 to generate timing signal MCASTT010. The signal MCASTS010 is applied via AND gate 204-18 to the CAS timing input of the even and odd stack units 210-20 and 210-40.

In a similar fashion, the AND gate 204-19 generates timing address signal MCASAD010. The signal MCASAD110 is applied via AND gate 204-20 to the address circuits of section 207.

The even and odd data registers 206-8 and 206-10 are tristate operated. More specifically, the registers are constructed from D-type transparent latch circuits such as those designated SN74S373 manufactured by Texas Instruments Incorporated. The register circuits are transparent meaning that while the signal applied to the G input terminal is a binary ONE, the signals at the Q output terminals follow the signals applied to the D input terminals. That is, when the signal applied to the G input terminal goes low, the signal at Q output terminal latches.

The output terminals of registers 206-8 and 206-10 are connected in common in a wired OR arrangement for enabling the multiplexing of the pair of data word signals. Such multiplexing is accomplished by controlling the states of the signals MQ2ELB000, MQ1ELB000, MDOTSC000 and MDRELB000 applied to the output control (OC) input terminals of the different sections of registers 206-8 and 206-10 shown in FIG. 3. This operation is independent of the latching action of the register flip-flops which takes place in response to the signals applied to the G input terminals.

The series connected group of gates 204-22 through 204-26 control the states of signals MDOTSC100 and MDOTSC010. The AND gate 204-22 receives timing signals DLYINN010 and DLY020100 at the beginning of a read or write cycle for enabling the storage of identification information from the bus. Since this is not pertinent to an understanding of the present invention, signal PULS20210 can be considered to be at a binary ZERO state. During a read operation, read command signal READCM000 is forced to a binary ZERO which causes AND gate 204-26 to force signal MDOTSC100 to a binary ZERO.

The signal MDOTSC100, when a binary ZERO, enables the middle sections of registers 206-8 and 206-10 to apply their contents to their output terminals. During a write cycle, when read command signal READCM000 is forced to a binary ONE, AND gate 204-26 forces signal MDOTSC100 to a binary ONE. This produces the opposite result to that described. That is, signal MDOTSC100 inhibits the middle sections of registers 206-8 and 206-10 from applying their contents to their output terminals.

The left most sections of registers 206-8 and 206-10 are enabled to apply their contents to their output terminals when signal MDRELB000 is a binary ZERO. Signal MDRELB000 for the purposes of the present invention can be considered to be in a binary ONE state. Thus, the right most sections of the registers are inhibited from applying their contents to their output terminals.

The left two most sections of registers 206-8 and 206-10 are controlled by the states of signals MQ1ELB000 and MQ2ELB000 which are generated by section 215. Signal MDOTSC000 when a binary ZERO enables one of the two left most sections of either register 206-8 or 206-10 as a function of the states of signals Q1TRST010 and Q2TRST000 from section 215. When signal Q1TRST010 is a binary ONE, signal Q2TRST000 is a binary ZERO and section 215 forces signal MQ1ELB000 to a binary ZERO. This enables the Q1 section of registers 206-8 and 206-10 to apply their contents to their output terminals. Conversely when signal Q1TRST010 is a binary ZERO, signal Q2TRST000 is a binary ONE and section 215 forces signal MQ1ELB000 to a binary ZERO. This enables the Q2 sections of registers 206-8 and 206-10 to apply their contents to their output terminals.

Lastly, the circuits of block 204 generate clocking signal CLOCK1010 which is applied to the circuits of block 216 as explained herein. As seen from FIG. 4a, an AND gate 204-33 generates signal CLOCK1010 in response to timing signal PULSCK010 which is a positive going timing pulse having a width between 20 and 50 nanoseconds. Signal PULSCK010 is gated with signals PARTWT000 and CYCINH000 to prevent the generation of signal CLOCK1010 during non-normal memory cycles (i.e., refresh cycle, etc.).

The timing signal PULSCK010 is generated within an AND gate 204-32 by combining timing signal DLY-3Y0010 with timing signal TTAP06010 after being inverted by an inverter circuit 204-31. Signal CYCINH00 is generated by a NOR gate 204-30 in response to signals REFCOM110 and STOPCY010 from section 205 while signal PARTWT000 is generated by the circuits of section 208.

SECTION 207

FIG. 4b illustrates the different sections of address section 207. As shown, section 207 includes an input address section 207-1, an address decode section 207-2 and an address register section 207-4.

SECTIONS 207-1 AND 207-2

The input address section 207-1 includes a register 207-12 for storing the least significant bus address bit 22 from circuits 213 and the high order chip select address bit signals BSADX3110 and BSADX4110 from section 216. The three signals are loaded into the register 207-12 when address strobe signal ADDSTR000 is forced to a binary ZERO. This occurs when the memory becomes busy (i.e., accepts a bus cycle/a memory request).

For the purposes of simplicity, register 207-12 can be considered as part of the queue address registers (not shown) of section 207. For further information regarding such queuing arrangement, reference may be made to the copending patent application of Robert B. Johnson and Chester M. Nibby, Jr. titled "A Memory Controller with Interleaved Queuing Apparatus", Ser. No. 202,821, filed on Oct. 31, 1980 and the copending application of George J. Barlow, Chester M. Nibby, Jr. and Robert B. Johnson titled "Pause Apparatus for a Memory Controller with Interleaved Queuing Apparatus", Ser. No. 331,933, filed on Dec. 17, 1981, both assigned to the assignee as named herein.

The section 207-1 also includes the boundary detection circuits of block 207-15. The circuits include a NAND gate 207-16 which connects to the D input terminal of a D-type flip-flop 207-19 via an AND gate 207-18. The NAND gate 207-16 receives memory request address bits 22-19 from bus 10. The gate 207-16 forces output detected boundary signal DBSA16000 to a binary ZERO when address bits 22-19 are all binary ONES. In all other cases, signal DBSA16000 is a binary ONE. Signal BSDBWD110 is a binary ONE when a double word transfer is being performed. Signal DBSA16000 when a binary ONE, causes AND gate 207-18 to force signal BOUNDY110 to a binary ONE causing flip-flop 207-19 to switch to a binary ONE. This forces signal MYBNDY010 to a binary ONE indicating the absence of any boundary condition. When signal DBSA16000 switches to a binary ZERO, this forces signal BOUNDY110 to a binary ZERO causing flip-flop 207-19 to switch from a binary ONE to a binary ZERO. The signal MYBNDY010 is applied as an input to timing section 204.

As shown, the high order address bit signals LSAD05210 and LSAD04210 are applied to the input terminals of a binary decoder circuit 207-20. The least significant bit address signal LSAD22210 and its complement signal LSAD22200 generated by an inverter circuit 207-22 are applied to sections 204 and 206.

The binary decoder 207-20 is enabled for operation by the grounding of a gate (G) terminal. Each of the four decode outputs DECOD0000 through DECOD3000 connects to a different pair of the NAND gates 207-24 through 207-30. It will be noted that the zero decode signal DECOD0000 connects to the input of NAND gate 207-24 which generates the 0 row address strobe signal DRAST0010. Similarly, the 1 decode signal DECOD1000 connects to the input of NAND gate 207-26 which generates the 1 row address strobe signal DRAST1010. The next sequential decode signal DECOD2000 connects to the NAND gate 207-28 which generates the next sequential row address strobe signal DRAST2010. Lastly, the last decode signal DECOD3000 connects to NAND gate 207-30 which generates the 3 row address strobe signal DRAST3010.

Also, these gates receive signal OVRDEC000 from an AND gate 207-32. When signal OVRDEC000 is a binary ZERO, this forces each of the signals DRAST0010 through DRAST3010 to a binary ONE state when either REFCOM100 or INITMM100 is in the ZERO state.

As shown, the even and odd row address strobe signals are applied to the RAM chips of the even and odd stack units 210-20 and 210-40.

SECTION 207-4

The address register section 207-4 as shown in FIG. 4b receives the bus address signals BSADX5210 through BSAD22210 applied via the queue address registers of section 207 as inputs to different stages of a row address register 207-40, a column address register 207-42 and an adder circuit 207-54.

The enabling gate input terminals of registers 207-40 and 207-42 are held at binary ONES enabling the storage of register input signals. The OC input terminal of row address register 207-40 is connected to receive a timing signal MRASCT000 generated by an AND gate 207-44, an inverter circuit 207-46 and a NAND gate 207-47 in response to signals INITMM000, REFCOM000 and MCASAD110. The OC input terminal of column address register 207-42 is connected to receive a timing signal MCASCT000 generated by NAND gate 207-50 in response to signals INTREF000 and MCASAD110. The signal INTREF000 is generated by AND gate 207-44 which receives signals INITM000 and REFCOM000.

Each of the address registers 207-40 and 207-42 is constructed from D-type transparent latch circuits such as those designated as SN74S373 previously discussed. As seen from FIG. 4b, the different address output terminals of the registers of each set are connected in common in a wired OR arrangement for enabling the multiplexing of these address signals. As previously described, such multiplexing is accomplished by controlling the state of the signals applied to the output control (OC) input terminals of the registers 207-40 and 207-42.

More specifically, the output control (OC) terminals enable so-called tristate operation which is controlled by the circuits 207-44 through 207-50. When each of the signals MRASCT000 and MCASCT000 is in a binary ONE state, this inhibits any address signals from being applied at the Q output terminals of the register associated therewith. As mentioned, this operation is independent of the latching action of the register flip-flops.

Additionally, in the preferred embodiment of the present invention, section 207-4 includes a 3-bit binary full adder circuit 207-54, convention in design which connects in parallel with address registers 207-40 and 207-42. The adder circuit 207-54 is connected to increment by one, the low order address bits 19 through 21. In greater detail, the input terminals A1-A4 receive bus address signals BSAD21210, BSAD20210 and BSAD19210 from the queue address registers of section 207. Binary ZERO signals are applied to input terminals A8 and B1-B8. The least significant address signal BSAD22210 is applied as a carry in signal to adder terminal CO as shown. As mentioned previously, the bus address signals can have as its source, the queue address registers of section 207.

The incremented output signals MADD00111 through MADD02111 appearing at adder sum terminals S1-S4 are applied to one set of input terminals of a multiplexer circuit 207-56. A second set of input terminals multiplexer 207-56 are connected to receive the address signals BSAD11210, BSAD12210 and BSAD13210 from the queue address registers of section 207. This eliminates register delays. The multiplexer circuit 207-56 is enabled by connecting an enable (EN) terminal to ground. The signal MCASAD110 from section 204 applied to a gate (G0/G1) terminal controls the selection of the source of address signals applied to the output terminals of multiplexer circuit 207-56. That is, when signal MCASAD110 is a binary ZERO, address signals BSAD11210, BSAD12210 and BSAD13210 are the source of signals MADD00211 through MADD02211. When signal MCASAD110 is a binary ONE, adder signals MADD00111 through MADD02111 are the source of signals MADD00211 through MADD02211.

Figure 4C:
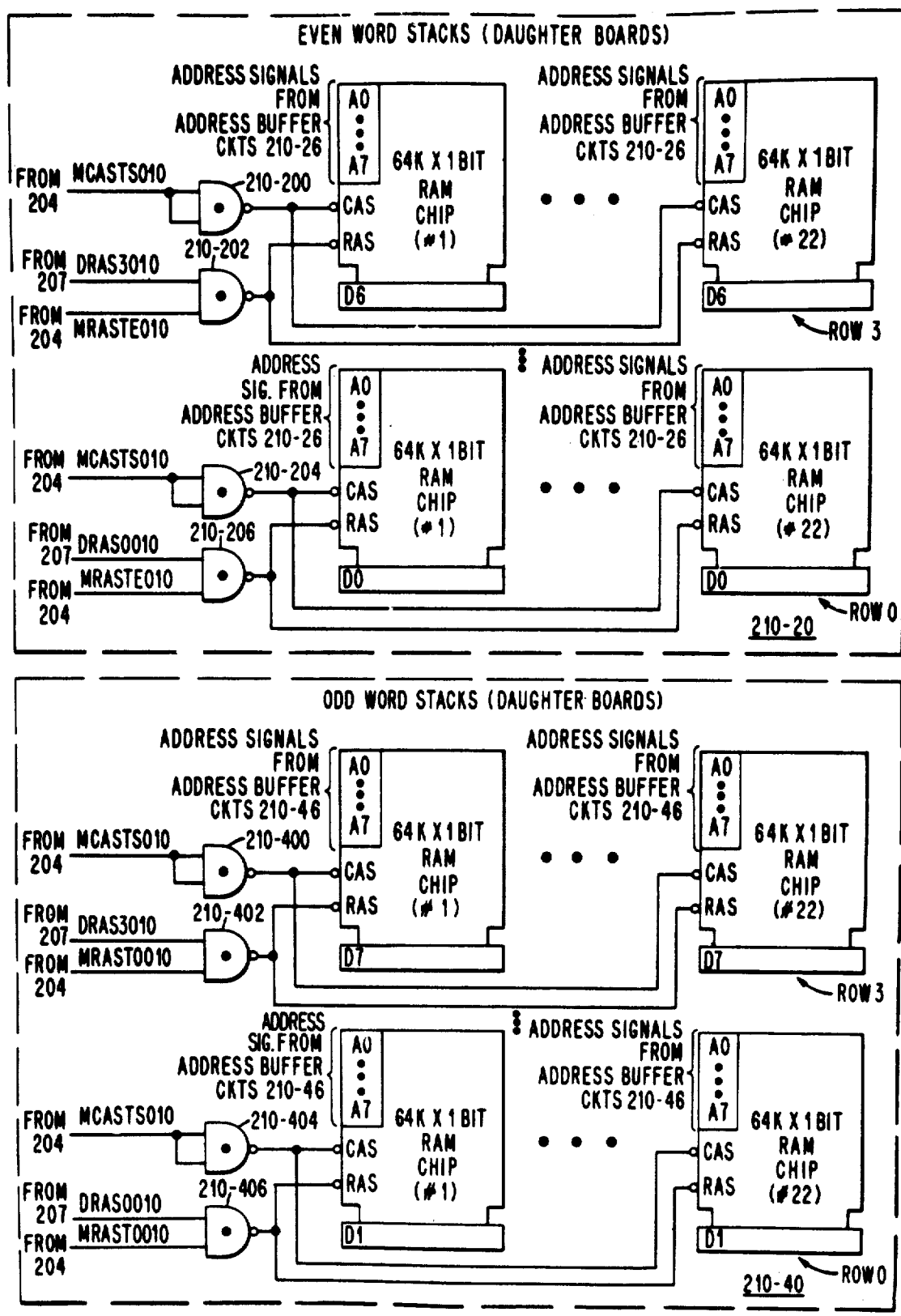

The odd stack RAM chips of FIG. 4c are connected to receive the address signals MADD0010 through MADD07010 via address buffer circuits 210-46. The even stack RAM chips of FIG. 4c are connected to receive address signals MADD0010 through MADD07010 via address buffer circuits 210-26 when signal MCASAD110 is a binary ZER0. When signal MCASAD110 is a binary ONE, the incremented output signals MADD00111 through MADD02111 are applied to the even stack RAM chips in lieu of signals MADD00010 through MADD02010 together with signals MADD03010 through MADD07010.

Memory Units 210-20 and 210-40—FIG. 4c

As previously discussed, the even word and odd word stack of blocks 210-20 and 210-40 are shown in greater detail in FIG. 4c. These stacks include four rows of 22, 64K × 1-bit RAM chips as shown. Each 64K chip includes two 32,768 bit storage arrays. Each array is organized into a 128 row by 256 column matrix and connects to a set of 256 sense amplifiers. It will be appreciated that other 64K chip organizations may also be utilized. The chips and associated gating circuits are mounted on a daughter board.

Each daughter board includes two inverters, not shown, which are connected to receive a corresponding one of the read/write command signals from section 208 and four, two input NAND gates (e.g. 210-200 through 210-206 and 210-400 through 210-406) which are connected to receive the row and column timing signals from section 204 and the row decode signals from section 207. Only those chip terminals pertinent to an understanding of the present invention are shown. The remaining terminals, not shown, are connected in a conventional manner. For further information, reference may be made to the copending patent application "Rotating Chip Selection Technique and Apparatus", invented by Chester M. Nibby, Jr. and William Panepinto, Jr., Ser. No. 921,292, filed on July 3, 1978 and assigned to the same assignee as named herein.

SECTION 216

FIG. 4d shows in greater detail the reconfiguration control circuits of the preferred embodiment of the present invention. These circuits generate signals for reconfiguring the controller daughter boards in response to diagnostic commands received from central processing unit 40.

As shown, section 216 includes a 3 to 8 binary decoder circuit 216-2, an EDAC mode flip-flop 216-4, a set of controller address switches 216-6, a reconfiguration register 216-8, a reconfiguration mode flip-flop 216-10, a controller address multiplexer circit 216-12, an address mode multiplexer circuit 216-14 and controller address compare circuits of blocks 216-16.

The decoder circuit 216-2 is enabled for operation when signal LSYEL0010 is forced to a binary ONE and signal LSWRIT010 is forced to a binary ZERO. The circuit 216-2 in response to particular codings of the binary coded signals BSAD21210, BSD20210 and BSAD19210 applied to its terminals A, B and C applied from the queue registers of section 207 forces a corresponding one of its terminals to a binary ZERO. For example, when bits 19, 20 and 21 have the value "000", signal READID000 is forced to a binary ZERO. Similarly, the values "001", "010", "011" and "100" respectively force signals READST000, SETEDA000, RESEDA000 and RECONF000 to binary ZEROS.

As shown, signal SETEDA000 is inverted by an inverter circuit 216-19 and applied to the preset (PR) input terminal of D-type flip-flop 216-4 via a NAND gate 216-18 while signal RESEDA000 is inverted by an inverter circuit 216-21 and applied to the clear (CLR) terminal of the same flip-flop via a NAND gate 216-20. Both NAND gates 216-18 and 216-20 receive timing signal PULS20010 from section 204. The flip-flop 216-4 also receives signal BSMCLR310 from section 211 which is applied to its clock (C) input terminal while its data (D) input terminal is connected to ground. The binary ONE and ZERO output terminals of flip-flop 216-4 are applied respectively as inputs to the identification register 206-22 and to the EDAC circuits of blocks 216-12 and 206-14. The signal EDACMM000 when a binary ZERO causes the sets of check bit signals (i.e., signals MDIEC0-C5) to be forced to binary ZEROS by circuits 26-12 and 216-14.

The signal READID000 is applied to the OC terminal of identification register 206-22 while the complement signal READID110 is applied to the gate (G) input terminal of register 206-24 via an inverter circuit 216-22. Similarly, signal READST000 is applied to the OC terminal of status register 206-20. The signal READID110 and signal READST110 generated by an inverter circuit 216-23 are applied as inputs to data multiplexer 206-16 and 206-18. When either signal READID110 or READST110 is a binary ONE, it inhibits the multiplexer circuits from applying data signals to bus 10. This allows the contents of register 206-20 or 206-22 to be substituted in their place. The status register 206-20 includes a pair of series connected registers, each having even and odd sections. The first register is constructed from standard integrated latch circuits designated as 74LS273. Each section of the latch or buffer register has a clock input which receives a timing signal MYDCNN210 from section 6 in response to the detection of a read error by the circuits of block 206-24. When an uncorrectable error is detected in either the even or odd word, the circuits 206-24 inhibit signal MYDCNN210 from being applied to the section(s) of the latch register. This freezes the contents of the register to facilitate diagnostic testing. The latch register sections are cleared or reset to ZEROS in response to either read status signal READST000 or reset data signal RESEDA000 from section 216 in addition to bus clear signal BSMCLR110.

The output signals from the sections of the latching register are applied to the sections of the second tristate output register which connects to data out lines MUXD00-15. This register also receives signal READST000 which is used to control the readout of the contents of the latch register to bus 10 in the same manner as registers 207-40 and 207-42 of FIG. 4b. The status register arrangement permits updating of read error status conditions in addition to clearing and freezing status as discussed herein.

The last decoder output signal RECONF000 is applied as one input to a NOR gate 216-24 along with signal BSAD07210 from queue register 207. The NOR circuit 216-24 generates signal RECONF110 which is applied as one input to an AND gate 216-26. The AND gate 216-26 receives a battery mode signal BATTMM000 from section 212 which during normal operation is a binary ONE. The timing signal CLOCK1010 from section 204 is applied during normal memory cycles as a third input to AND gate 216-26. The output signal MCONCK010 is applied to the clock input terminals (CLK) and (C) of the different stages of register 216-8. When signal RECONF110 is forced to a binary ONE by decoder circuit 216-2 and signal BSAD07210 is a binary ZERO, timing signal CLOCK1010 causes AND gate 216-26 to force signal MCONCK010 to a binary ONE.

As concerns signal BSAD07210, bus address bit 7 is forced to a binary ONE in response to a command specifying a system general reset of all memory controllers. This address bit together with the rest of the command bits are stored in the queue section of the addressed memory controller. However, since signal BSAD07210 from queue register 207 is a binary ONE, it inhibits NOR gate 216-24 from forcing signal RECONF110 to a binary ONE in response to reconfiguration signal RECONF000 generated by the stored reconfiguration command. This in turn prevents reconfiguration mode flip-flop 216-10 from being set again following the system general reset operation.

The positive going transition of clocking signal MCONCK010 enables register 216-8 to be loaded with the states of the address bit signals BSAD08210 through BSAD17210 of a bus memory request received from section 207.

It will also be noted that signal MCONCK010 is inverted by an inverter circuit 216-28 and applied as signal MCONST100 to the preset (PR) terminal of flip-flop 216-10. When signal MCONST100 switches to a binary ZERO, flip-flop 216-10 switches to a binary ONE. The data (D) terminal of the flip-flop 216-10 receives signal RCONCT110 generated by a NOR gate 216-29, an inverter circuit 216-33 and NAND gates 216-30, 216-31 and 216-32 in response to signals BATTMM000, RCFIGU010, BSAD07110, BSMREF110 BSAD19110, BSAD20110, BSAD21110 and BSYELO110. The timing signal DCNR60110 is applied to the clock (C) input terminal of flip-flop 216-10 from section 211.

When signal BATTMM000 is a binary ONE indicating that the controller is not in a battery mode of operation and signals BSYELO110, BSMREF110, BAD19110 and BSAD07110 are binary ONES, and signals BSAD20110 and BSAD21110 are binary ZEROS, NAND gate 216-30 forces signal RCONCT110 to a binary ZERO. This enables reconfiguration mode flip-flop 216-10 to be reset to a binary ZERO state when timing signal DCNR60110 switches from a binary ZERO to a binary ONE. The states of both reconfiguration code address bits 19, 20 and 21 and bus address bit 7 determine when reconfiguration mode flip-flop 216-20 will be reset to a binary ZERO state. This prevents the inadvertent clearing of reconfiguration mode flip-flop of any memory controller while in non-reconfiguration diagnostic mode.

As shown, certain stages of register 216-8 are cleared in response to a system power up signal PWONLL010 generated by section 211 which switches from a binary ZERO to a binary ONE after system power is established (i.e., valid). Signal PWONLL010 when a binary ZERO causes the register stages to be cleared to ZEROS. The interleave mode flip-flop stage storing signal INTERL000 is powered up in the binary ONE state by signal PWONLL010 applied to the PR input terminal of the stage. That is, signal PWONLL010 when a binary ZERO switches the interleave mode stage to a binary ONE which forces signal INTERL000 to a binary ZERO.

The binary ONE output of reconfiguration mode flip-flop 216-10 is applied as an input to register 206-22, to select control input terminal of enabled multiplexer circuit 216-12 and to NAND gate 216-30.

As seen from FIG. 4d, the multiplexer circuit 216-12 receives a first set of controller address signals BSSW00010 through BSSW03010 from manual switches S1 through S4 as shown. When any of the switches are closed, this forces a corresponding one of the address signals BSSW00010 through BSSW03010 to a binary ZERO. When the same switch is placed in an open position, this causes the corresponding address signal to be a binary ONE. The binary ONE signal provided via one of the pull-up resistors 216-34 through 216-42 which connect to a voltage +V.

The second set of address signals RCONF0010 through RCONF3010 applied to multiplexer circuit 216-12 are from the stages of register 216-8 storing the states of bus address bits BSAD08210 through BSAD11210. When signal RCFIGU010 is a binary ZERO, the multiplexer circuit 216-12 selects switches S1–S4 as the source of signals BSSW00110 through BSSW03110. When signal RCFIGU010 is a binary ONE, multiplexer circuit 216-12 selects the indicated stages of register 216-8 as the source of signals BSSW00100 through BSSW03110.

Signals from the remaining switches S5 and S6 are applied as inputs to the compare circuits 216-16 and to the multiplexer circuit 216-14. That is, signal INTESW000 is applied via series connected inverter circuit 216-44 and a NOR gate 216-46 to the select control input terminal of multiplexer circuit 216-14. The state of switch S5 defines whether or not the controller is operating in an interleaved or banked mode of operation. When switch S5 is open, signal INTESW000 is a binary ONE and the controller's addressing mode is defined by the state of the interleave mode flip-flop stage which is set to a binary ONE during power-up. This causes signal INTERL000 to be a binary ZERO. This causes NOR gate 216-46 to force signal INTERL110 to a binary ONE. When signal INTERL110 is a binary ONE, multiplexer circuit 216-14 selects address bit signals BSAD03110, BSAD04110 and BSAD05110 as the source of signals BSADX3010, BSADX4010 and BSADX5010.

A banked mode of operation is specified either by placing switch S5 in the closed position or by switching the interleave mode flip-flop stage to a binary ZERO during controller reconfiguration when bus address bit signal BSAD17210 is a binary ZERO. This results in forcing signal INTERL110 to a binary ZERO which causes multiplexer circuit 216-14 to select address bit signals BSAD04110, BSAD05110 and BSAD18110 as the source of signals BSADX3010, BSADX4010 and BSADX5010.

The signal BSADX5010 is applied to row address register 207-40 via the queue registers of section 207. The queue registers provide the required storage of memory request addresses for an entire memory cycle of operation.

The signals BSADX3010 and BSADX4110 are logically combined with configuration signals HALFBS010 and QARTBS010 within a pair of exclusive OR circuits 216-50 and 216-52 as shown. The resulting signals BSADX3110 and BSADX4110 are applied as inputs to section 207 for decoding. Additionally, signals HALFBS010 and QARTBS010 are applied as inputs to identification register 206-22 along with interleave mode signal INTERL110 generated by NOR gate 216-46.

The last switch signal MODINH000 applied via an inverter circuit 216-54 is used for enabling/disabling the compare circuits of block 216-16. When switch S6 is placed in an open position, signal MODINH000 is a binary ONE. When in this state, each of the comparison circuits 216-160 and 216-162 are enabled for operation. When switch S6 is placed in a closed position, signal MODINH000 is a binary ZERO and the circuits 216-160 and 216-162 are disabled.

Now considering the circuits of block 216-16, it is seen that the comparison circuit 216-160 receives those controller address input signals used for memory communication when the controller is operating in an interleaved mode of operation. The comparison circuit 216-162 receives those controller address input signals used for memory communication in a banked mode of operation. When either circuit 216-160 or 216-162 detects a true comparison, it forces a corresponding one of the signals MYADG0100 and MYADG0200 from a binary ONE to a binary ZERO. This in turn causes an AND gate 216-164 which receives signals MYADG0100 and MYADG0200 to force its output signal MYADG0001 from a binary ONE to a binary ZERO. The signal MYADG0001 which is applied as an input to the bus response circuits of section 211 causes an appropriate response to be generated.

SECTION 211

Figure 4E:
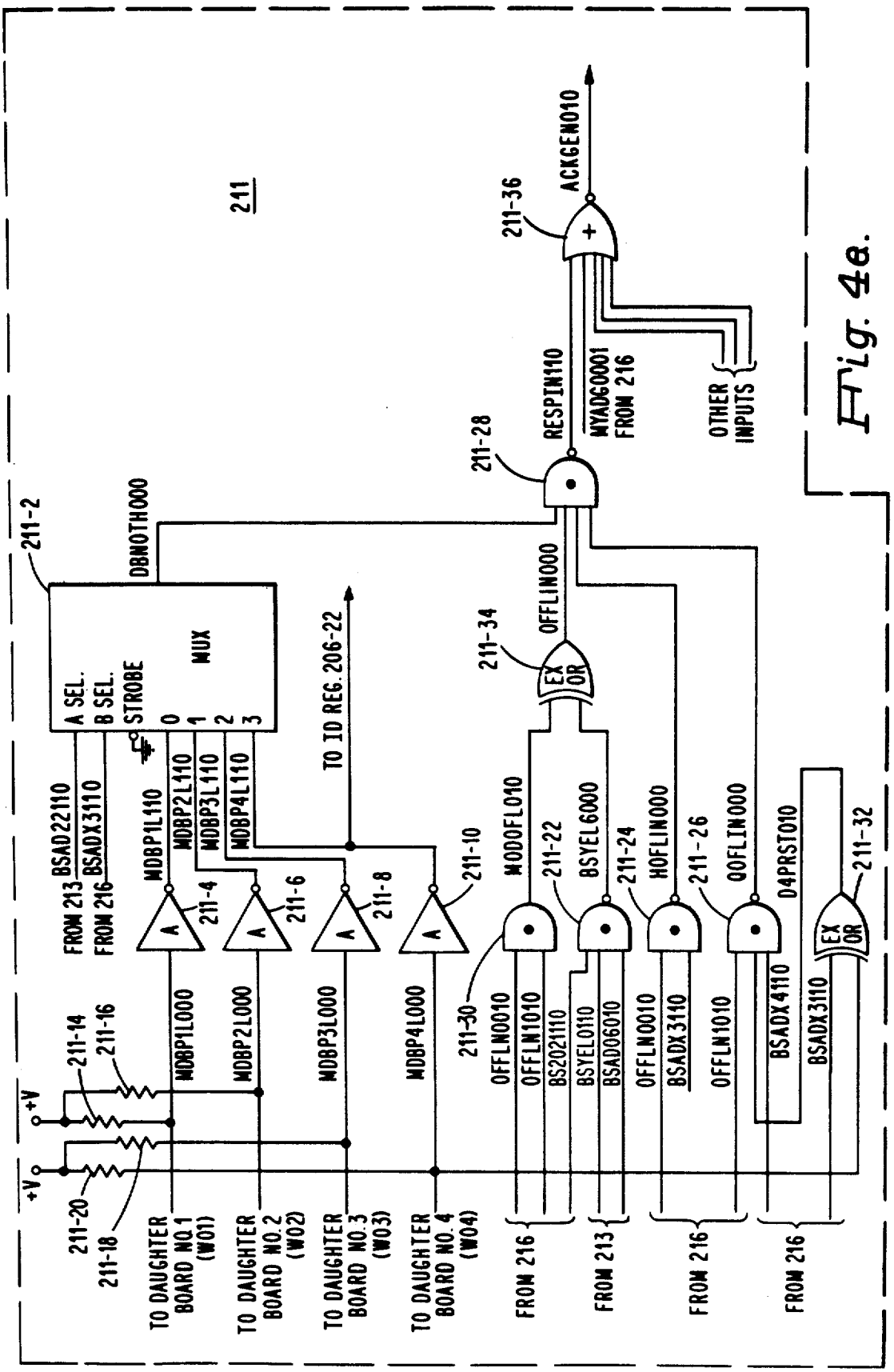

FIG. 4e shows in greater detail a portion of the bus response circuits of the preferred embodiment of the present invention. These circuits operate to provide the appropriate responses to memory commands addressed to the controller. The response circuits include a data selector circuit 211-2, a plurality of inverter circuits 211-4 through 211-10 and associated pull-up resistors 211-14 through 211-20, a plurality of NAND gates 211-22 through 211-28, an AND gate 211-30, a pair of exclusive OR circuits 211-32 and 211-34 and a NOR gate 211-36 connected as shown.

The circuit 211-2 is connected to receive data signals MDBP1L110 through MDBP4L110 generated by corresponding ones of up to four memory daughter boards. In greater detail, when each of the four daughter boards are connected in the memory subsystem, the signals MDBP1L000 through MDBP4L000 are binary ZEROS. That is, the inputs to each of the inverter circuits 211-4 through 211-10 are grounded. This in turn forces MDBP1L110 through MDBP4L110 to binary ONES. However, when any daughter board is missing, this causes a corresponding one of the signals MDBP1L000 through MDBP4L000 to be a binary ONE. That is, the input from the daughter board is floating or not connected which applies voltage +V through a pull-up resistor to the input of one of the inverter circuits 211-4 through 211-10.

Address signals BSAD22110 and BSADX3110 identifying the daughter board being addressed are applied to the select input terminals of data selector circuit 211-2. The circuit 211-2 applies as a source of output daughter board not here signal DBNOTH000, the daughter board signal selected by signals BSAD22110 and BSADX3110. When the daughter board being addressed is connected to the controller, signal DBNOTH000 is forced to a binary ONE. However, when the addressed daughter board is not present (e.g. half populated controller), signal DBNOTH000 is forced to a binary ZERO state.

The signal DBNOTH000 is applied as one input to NAND gate 211-28. The three other input signals OFFLIN000, HOFLIN000, QOFLIN000 to NAND gate 211-28 provide the capabilities of operating the controller memory off-line (i.e., full controller memory off-line, half controller memory off-line and quarter controller memory off-line).

Signal OFFLIN000 is generated by gates 211-22, 211-30 and 211-34. When signal OFFLIN000 is forced to a binary ZERO in response to a diagnostic command, this indicates that a full controller memory as shown in FIG. 1 is in the off-line state. Signal OFFLIN000 is generated by performing an exclusive OR of signals MODOFL010 and BSYEL6000 generated by gates 211-30 and 211-22. Signal MODOFL010 is generated by AND gate 211-30 which combines signals OFFLN0010 and OFFLN1010 received from section 216. Signal BSYEL6000 is generated by NAND gate 211-22 which combines bus signals BSYEL0110 and BSAD06010 received from section 213 and signal BS202110 received from section 216. Thus, the exclusive ORing of signals MODOFL010 and BSYEL6000 by gate 211-34 enables off-line communication with a controller only during diagnostic cycles initiated in response to READID and reconfiguration mode commands. This prevents the inadvertent addressing of off-line modules during other diagnostic cycles.

The signals HOFLIN000 and QOFLIN000, respectively, indicate when the controller is being operated in half off-line and quarter off-line modes of operation. When any one of the signals DBNOTH000 through QOFLIN000 is forced to a binary ZERO, NAND gate 211-28 forces response signal RESPIN110 to a binary ONE. This inhibits NOR gate 211-36 from forcing acknowledge signal ACKGEN010 to a binary ONE. Hence, the controller does not generate a response to memory requests when the controller is operating in off-line, half off-line and quarter off-line modes of operation (i.e., full memory, half memory or quarter memory sections of the controller have been placed in an off-line state or have not been installed (e.g. half populated controller).

DESCRIPTION OF OPERATION

With reference to FIGS. 1 through 4e, the operation of the memory system of the present invention will now be described with particular reference to the diagrams of FIGS. 7a through 10b.

Figure 5A:
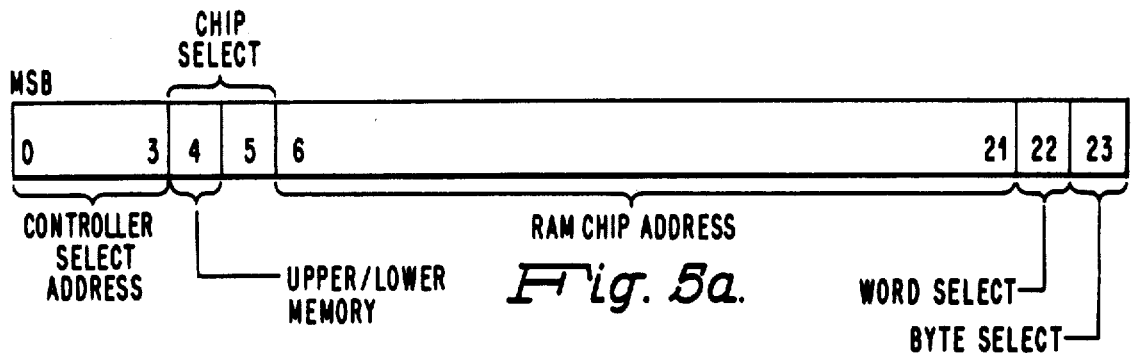
FIG. 5a illustrates the format of the address applied to the controllers of FIG. 1 when the system is being operated in banked mode.
Figure 5B:
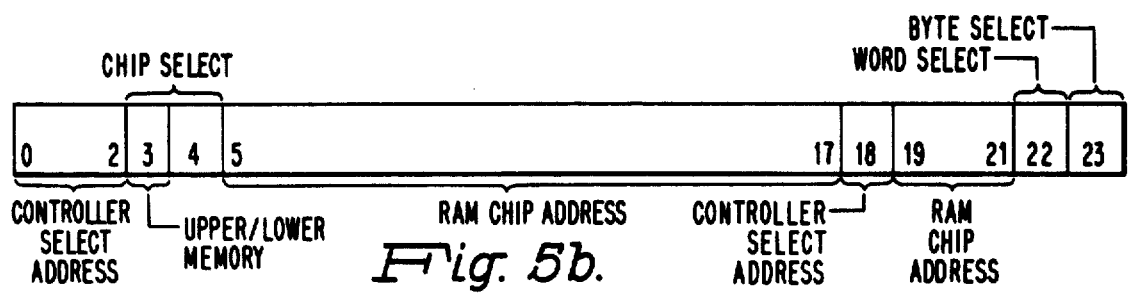
FIG. 5b illustrates the format of the address applied to the controllers of FIG. 1 when the system is being operated in interleaved mode.

Before discussing an example of operation, reference is first made to FIGS. 5a and 5b. FIG. 5a illustrates the format of the memory addresses applied to the controller as part of each memory read or write request when the system of FIG. 1 is being operated in banked mode. The four high order/most significant bit positions 0–3 are coded to identify which of the sixteen memory controllers is to process the request. Address bit 4 is used to select which 256K half (i.e., upper or lower half) of controller memory is being accessed. Also, bit 4 together with address bit 5 are coded to select which row of RAM chips are being addressed. As discussed hereon, these bits are decoded and used to generate a row address strobe (RAS) signal which latches the 8-bit row addresses into the desired row of RAM chips within a pair of memory stacks. These address bits are processed by the circuits of each controller and are not provided to the RAM chips.

Address bits 6–21 specify the address of the 22-bit storage location within the RAM chips being addressed. As explained in greater detail herein, these 16 address bits are multiplexed into 8 address inputs and applied via the address buffer circuits of blocks 210-26 and 210-46 to the address input terminals A0–A7 of the RAM chips of FIG. 4c.

The least significant address bits 22 and 23 are coded to select which word and byte are being addressed.

FIG. 5b illustrates the format of the memory addresses when the system of FIG. 1 is being operated in interleaved mode. The differences as seen from the Figures are that the most significant bit positions 0–2 and bit 18 identify the controller which is to process the request. Address bit 3 is used to select which 256K half of controller memory is being accessed. Bits 3 and 4 select the row of RAM chips being addressed and address bits 5–21 excluding bit 18 specifying the location being addressed.

Figure 6A:
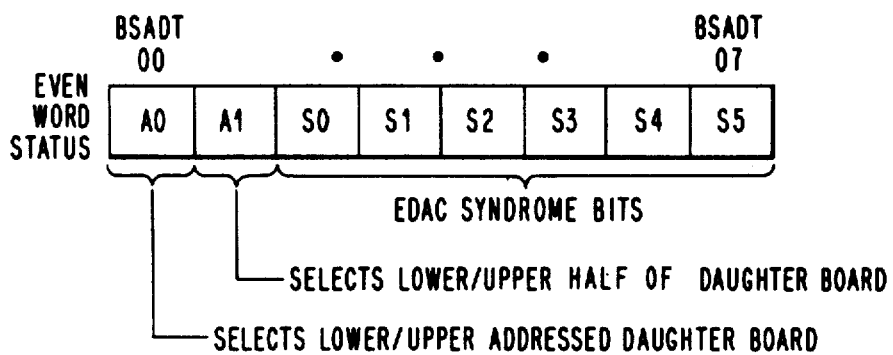
FIG. 6a illustrates the format of the status word register contents applied to bus 10 by a controller in response to a read status word diagnostic command.
Figure 6A:
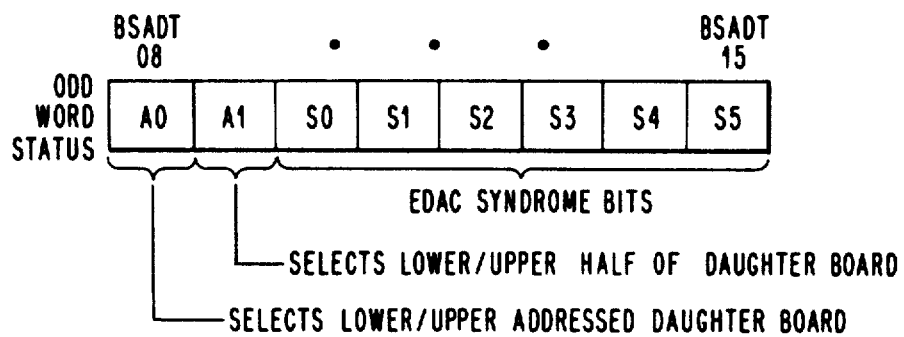
Figure 6C:
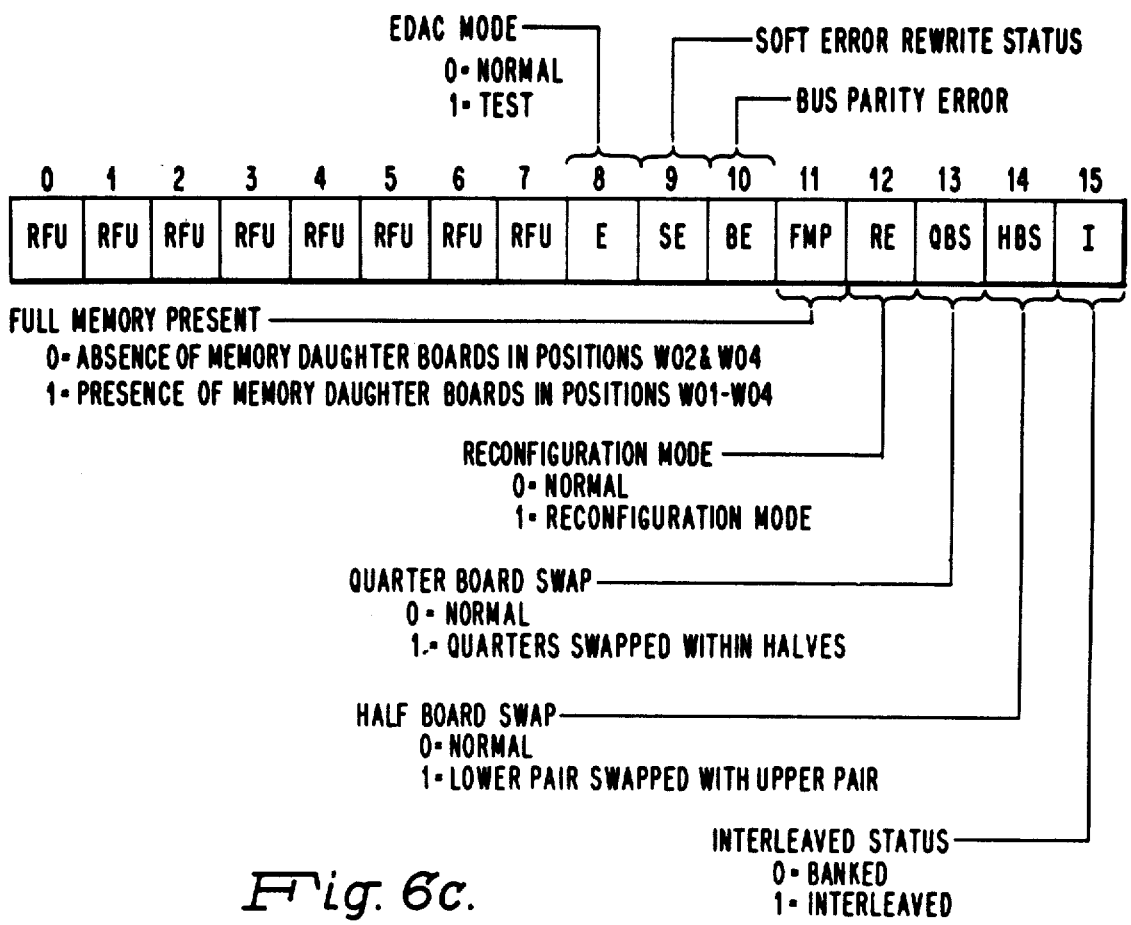
FIG. 6c illustrates the format of the identification register 206-20 of FIG. 1.
Figure 6D:
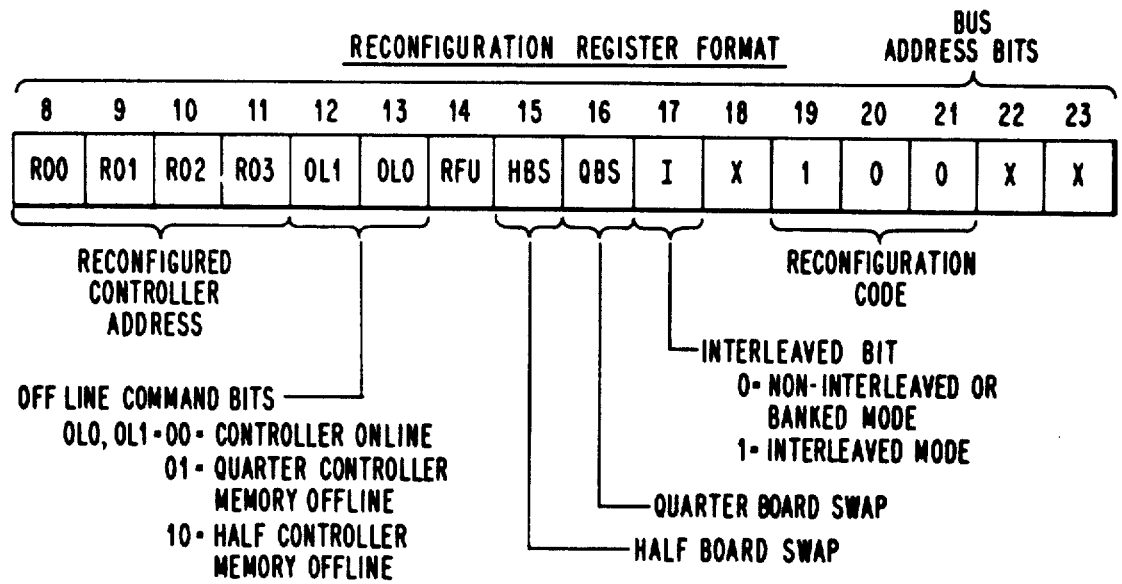
FIG. 6d illustrates the format of a reconfiguration register included within reconfiguration section 216 of FIG. 1.

FIG. 6d illustrates the format of the memory address to be loaded into the reconfiguration register 216-8 of an addressed controller which is applied as part of a command specifying a reconfiguration operation. Address bits 19, 20, and 21 define the type of operation to be performed. As seen from FIG. 6d, the diagnostic code "100" causes the addressed controller to be placed in a reconfigured mode. Before discussing this mode, as indicated previously, other codes such as "010", place the controller in an EDAC test mode wherein the controller reads out the contents of the location being addressed and transfers that the contents to bus 10. While in this mode, the controller inhibits the generation of certain bus error indicator signals generated by circuits 206-24 of FIG. 3 during read cycles and forces the check bit signals to ZEROS during write cycles.

A diagnostic code of "011" causes a controller to reset the EDAC mode. In response to this code, the controller clears status and EDAC check bit indicators and reads the contents of the location being addressed and transfers the contents to bus 10.

A diagnostic code of "000" specifies a read identification register operation and causes the controller to read out the contents of the location being addressed as specified by either address bits 3–22 or address bits 4–22. However, the controller substitutes the contents of identification register 206-22 for the contents of the addressed location and transfers same to bus 10. In a similar fashion, a code of "001" causes the controller to transfer the contents of status register 206-20 to bus 10 in place of the contents of the addressed location.

Now considering FIG. 6d in greater detail, it is seen that bus address bits 8–11 are coded to specify the address to which the controller is to respond while operating the reconfigured mode. Bus address bits 12 and 13 are coded to specify which part of the controller (i.e., the entire controller, half the controller or a quarter of the controller) is being placed off-line. Bus address bits 15 and 16 are coded to specify the type of controller reconfiguration. As seen from FIG. 6d, when bit 15 is a binary ONE, this specifies that the controller is to swap or exchange both pairs of daughter boards. When bit 16 is a binary ONE, this specifies that the controller is to swap or exchange sections (i.e., rows as defined by the decode signals from section 207-2) within a pair of daughter boards. Lastly, bit 17 is coded to specify when the controller is to operate in an interleaved mode of operation.

FIGS. 6a and 6c illustrate the formats of the contents of status register 206-20 and identification register 206-22 in accordance with the present invention. As seen from FIG. 6a, he 16-bit register stores combinations of decode address bits (i.e., LSADX3010 and LSADX4010) from register 207-12 of FIG. 4b and syndrome bits S0 through S5 which allow the isolation of single bit errors to the RAM chip. For further information regarding the generation and detection of errors using syndrome bits, reference may be made to U.S. Pat. No. 4,072,853. As mentioned previously, the status register 206-20 stores syndrome signals indicative of the most recent single bit error. Upon the occurrence of an uncorrectable error (i.e., double bit error), the red generator circuits of block 206-24 generate signals which freeze the contents of the status register 206-20.

As seen from FIG. 6c, the identification register 206-22 stores indications of controller's reconfiguration mode, addressing mode in addition to other status information. More specifically, bit position 8 stores the state of EDAC mode flip-flop 216-4. Bit positions 9 and 10 store indications of soft errors and bus parity errors. The soft error status indicates the result of performing memory rewrite operations at normal memory speed or at faster speeds. For the purpose of the present invention, such indications further define the operability of memory. The copending patent application of Robert B. Johnson and Chester M. Nibby, Jr. entitled "A Method and Apparatus for Testing and Verifying the Operation of Error Control Apparatus Included Within a Memory System", Ser. No. 172,486, filed July 25, 1980 and assigned to the same assignee as named herein.

Bit position 11 stores the state of signal MDBP4L110 generated by the circuits of section 211 of FIG. 4e. Bit position 12 stores the state of reconfiguration mode flip-flop 216-10. Bit positions 13 through 15 store indications of certain ones of the stages of reconfiguration register 216-6, such as the states of the quarter board swap, half board swap and interleave mode stages.

In accordance with the teachings of the present invention, the memory system of FIG. 1 can reconfigure so as to provide a contingous addressable address space as a function of the addressing mode of operation and the type of error and its location. In each example, it is assumed that each memory controller of FIG. 1 is fully populated (i.e., two pairs of daughter boards) with 64K RAM chips such as illustrated in FIG. 6b. That is, each controller has 512K words (i.e., 524,288 words) of addressable storage. When the memory system is being operated in the interleaved address mode, each pair of controllers has addresses arranged as shown in FIG. 6b.

The type of memory reconfiguration illustrated in FIGS. 7a and 7b will now be discussed. For this reconfiguration, the system is assumed to be operating in the banked mode. It will be appreciated that prior to issuing a reconfiguration command, central processing unit 40 will have carried out various diagnostic operations within the controller or controllers of FIG. 1 which reported the detection of an uncorrectable error condition. Such operations normally involve the issuance of a diagnostic command specifying the readout of status register 206-20. The controller decoder circuit 216-2 in response to the decoding of the command forces signal READST000 to a binary ZERO and signal READST010 to a binary ONE. These signals condition register 206-20 and the data out multiplexer circuits 206-16 and 206-18 for read out of status information to bus 10 via lines MUXD00-15.

From the status information of FIG. 6a, it is possible to locate the defective memory location. After this has been done, it may be desirable to carry out further test operations to verify that this is the only location in memory which is defective. Such testing for the purposes of the present invention can be considered conventional and does not form a part of this invention. For a further discussion of memory testing, reference may be made to the patent application of Robert B. Johnson and Chester M. Nibby, Jr. entitled "A Method and Apparatus for Testing and Verifying the Operation of Error Control Apparatus Included Within a Memory System", Ser. No. 172,486, filed on July 25, 1980 and assigned to the same assignee as named herein.

Figure 7A:
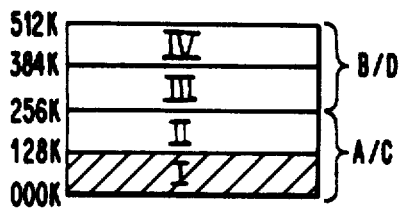
FIGS. 7a through 10b are used in explaining the manner in which the memory system and controllers of FIG. 1 can be reconfigured in accordance with the teachings of the present invention.
Figure 7B:
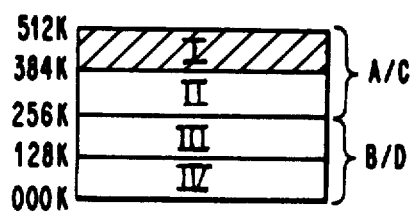

Following such testing, it is assumed that processing unit 40 has determined that word location 000000 of FIG. 6b is defective and has rendered the portion of memory system of FIG. 1 unusable as shown in FIG. 7a. The reconfiguration apparatus of the present invention can be made to place the defective location at the top portion of the controller memory as shown in FIG. 7b. This is accomplished by having processing unit 40 issue a diagnostic memory read command specifying that the controller's memory be so reconfigured. The command address bits to be loaded into reconfiguration register 216-8 are coded as follows:

bits 8–11 = 0000
bits 12–13 = 00
bit 15 = 1
bit 16 = 1
bit 17 = 0
bits 19–21 = 100.

Since the controllers are being operated in a banked address mode, address bits 0–3 are coded to specify the address of the controller having the defective location. It will be assumed that the controller assigned an all ZERO address (i.e., controller 200-1 of FIG. 1) has the defective memory and thus all of the other address bits (i.e., 0–7) are binary ZEROS.

When processing unit 40 applies the diagnostic memory command to bus 10, it also forces lines BSYELO and BSMREF to binary ONES. Also, lines BSWRIT and BSDBPL remain binary ZEROS indicating that controller 200-1 is to perform a read cycle of operation for readout of one word from the defective module A of FIG. 1. When the comparison circuit 216-162 of FIG. 4d detects a true comparison between address bits 0–3 and the controller address defined by the switches S1-S4, it forces signal MYADG0200 to a binary ZERO. This forces signal MYADG0001 to a binary ZERO enabling the bus response circuits of section 211 to generate an appropriate bus response to processing unit 40 which results in the generation of signal MYACKR010.

Signal MYACKR010 starts a memory cycle of operation during which the timing circuits 204 of FIG. 4a generate a sequence of signals for read out of a single word from the memory location specified by address bits 4–22 of FIG. 6a. Briefly, the memory cycle of operation involves the following sequence. The signal MYACKR010 causes the circuits 204 to force the memory busy signal MEMBUZ010 to a binary ONE indicating that controller #0 has begun a memory cycle of operation. The bus address signals BSAD06210 through BSAD21210 are then transferred from bus 10 into row address register 207-40 and column address register 207-42 of FIG. 4b. The signal MEMBUZ010 switches signal ADDSTR000 of FIG. 4b to a binary ZERO. This loads the least significant address bit BSAD22110 and chip select address signals BSADX3110 and BSADX4110 into register 207-12.

A timing signal from circuits 204 causes section 204 to switch line BSREQT to a binary ZERO indicating that controller #0 has accepted the memory reconfiguration command. Assuming that controller #0 has the highest priority, section 211 switches signal MYDCNN010 to a binary ONE. This signal is inverted by the circuits 213 and applied to bus line BSDCNN.

As seen from FIG. 4d, signal CLOCK1010 when forced to a binary ONE enables reconfiguration register 216-8 to be loaded with command address bits 8-17 and causes reconfiguration mode flip-flop 216-10 to switch to a binary ONE. More specifically, as previously mentioned, line BSYELO signals controller 200-1 that the memory address being applied to lines BSAD00-23 includes a diagnostic command code. The binary ONE signal BSYEL010 upon being stored in section 208 forces signal LSYEL0010 to a binary ONE. This signal together with signal LSWRIT010 enables decoder circuit 216-2 of FIG. 4d. In response to the code "100", decoder circuit 216-2 forces signal RECONF000 to a binary ZERO. This results in reconfiguration mode flip-flop 216-10 being switched to a binary ONE when timing signal CLOCK1010 switches to a binary ONE.

During the memory cycle of operation, the stored chip select address signals are decoded by decoder circuit 207-20. This results in decoder circuit 207-20 forcing one of the decode signals to a binary ZERO. During RAS time (i.e., when signal MCASAD110 is a binary ZERO), the row address signals from row address register 207-40 are loaded into the rows of RAM chips of units 210-20 and 210-40. Thereafter, the column address signals from column address register 207-42 and multiplexer circuit 207-56 are loaded into the RAM chips of units 210-20 and 210-40 during CAS time (i.e., when signal MCASAD010 switches to a binary ONE).

The contents of the storage locations defined by the row and column address are accessed and read out into registers 206-8 and 206-10. The requested single word is applied to bus 10 completing the memory cycle of operation.

Signal MCONCK010 causes the stages of reconfiguration register 216-8 to be loaded with address bits BSAD8-17. However, until flip-flop 216-10 switches to a binary ONE state, reconfiguration will not take place. Upon such switching, multiplexer circuit 216-12 is now conditioned to utilize as a controller address, signals RCONF0010 through RCONF3010. At this time, both signals HALFBS010 and QARTBS010 are binary ONES. Accordingly, the coding of the address bit signals BSADX3110 and BSADX4110 generated by exclusive OR circuits 216-50 and 216-52 are reversed or complemented. That is, the states of the chip select bits 4 and 5 in each memory request are automatically complemented which when decoded by address decoder circuit 207-20 reverses the logical order of generating output signals DRAST0010 through DRAST3010. This means that daughter board pairs A/C (I,II) and B/C (III,IV) are exchanged or swapped in response to signal HALFS010. Additionally, as seen from FIG. 7b, the upper and lower halves of each daughter board pair are exchanged or swapped in response to signal QARTBS010 (i.e., I and II within daughter board pairs A/C and III and IV within daughter board pairs B/D).

Figure 8A:
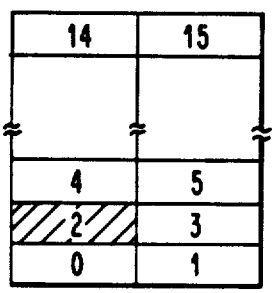

FIGS. 8a through 8e illustrate another example of how the memory system of FIG. 1 can be reconfigured in the case of a defective controller. As mentioned previously, the system of FIG. 1 is assumed to include 16 memory subsystems arranged in pairs of interleaved modules as indicated in FIG. 8a. Each pair includes two megabytes of storage oranized as illustrated in FIG. 6b. It is assumed that the controller assigned address 0010 (#2) includes defective storage locations which render the entire controller memory unusable. If left in this state, central processing unit 40 would have to map around the address space provided by the controllers assigned addresses 0010 (#2) and 0011 (#3) since the controllers are operating in the interleaved address mode.

Figure 8B:
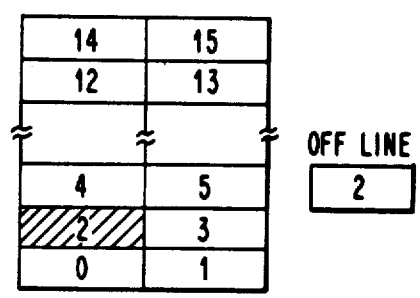
Figure 8C:
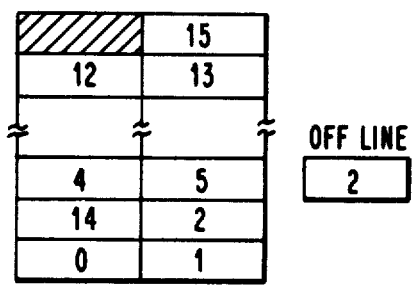
Figure 8D:
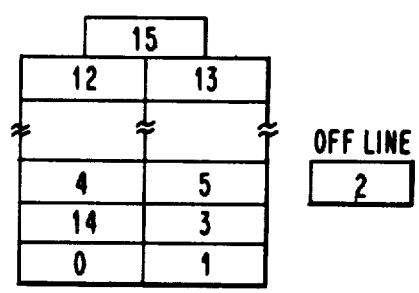

Through the use of a series of reconfiguration commands, the memory system of FIG. 1 can be reconfigured as illustrated in FIGS. 8b through 8d to provide a contiguous address space. By means of a first reconfiguration command, the controller assigned binary address 0010 (#2) is placed off-line with the same address. The reconfiguration command address bits are coded as follows:

bits 8-11=0010
bits 12-13=11
bit 15=0
bit 16=0
bit 17=1
bits 19-21=100.

Here, address bits 0-2 and 18 are coded to specify address 0010 (#2). Also, the BSYELO, BSMREF and BSWRIT lines are conditioned in the same manner as described above. Controller #2 in response to the reconfiguration command switches reconfiguration mode flip-flop 216-10 to a binary ONE and load address bits 8-21 into register 216-8. Since off-line signals OFFLN0010 and OFFLN1010 are both binary ONES, this inhibits the bus response circuits of FIG. 4e from responding to memory requests directed to controller address #2 as illustrated in FIG. 8b. That is, AND gate 211-30 forces signal MODOFL010 to a binary ONE state. Since signal BSYEL6000 is normally a binary ZERO for normal memory commands, exclusive OR gate 211-34 forces signal OFFLIN000 to a binary ZERO. This in turn causes NAND gate 211-28 to force signal RESPIN110 to a binary ONE inhibiting NOR gate 211-36 from forcing acknowledge signal ACKGEN010 to a binary ONE.

Next, processing unit 40 generates a second reconfiguration command which reconfigures the controller having address 1110 (#14) in place of controller #2. The reconfiguration command address bits are coded as follows:

bits 8-11=0010
bits 12-13=00
bit 15=0
bit 16=0
bit 17=1
bits 19-21=100.

In this instance, address bits 0-2 and 18 are coded to specify address 1110 (#14). Again, the BSYELO, BSMREF and BSWRIT lines are conditioned in the same manner as previously described. Controller #14 upon decoding the reconfiguration command switches its reconfiguration mode flip-flop 216-10 to a binary ONE and loads address bits 8–21 into register 216-8. Accordingly, controller 14 now is conditioned to compare the controller address value 0010 in register 216-8 with the subsequently received memory requests. Accordingly, controller #14 now functions as controller #2. Also, controller #14 is conditioned to operate in the interleaved address mode in conjunction with controller #3 as indicated in FIG. 8c.

Also, it will be noted from FIG. 8c that the memory provided by controller #14 is now absent. Therefore, in order to take controller 15, a further reconfiguration command is generated which reconfigures controller #15 to provide contiguous memory beyond that provided by controllers #12 and #13 as shown in FIG. 8d. The reconfiguration command address bits are coded as follows:

bits 8–11 = 1110
bits 12–13 = 00
bit 15 = 0
bit 16 = 0
bit 17 = 0
bits 19–21 = 100.

Address bits 0–2 and 18 are coded to specify controller address 1111 (#15). In response to the command, controller #15 switches its reconfiguration mode flip-flop 216-10 to a binary ONE and loads the command address bits into reconfiguration register 216-8. When once reconfigured as indicated, controller #15 compares the controller address value 1110 (#14) with the subsequent received memory requests and operates in the banked address mode. That is, it compares the memory request address bits 0–3 with controller address value 1110 (#14) thereby providing contiguous memory starting with addresses having values one greater than the maximum address value provided by controllers #12 and #13 of FIG. 8d.

From the above, it is seen how a defective controller can be placed "off-line" and another controller substituted in its place so as to provide a contiguous fault free addressable memory space.

Figure 8E:
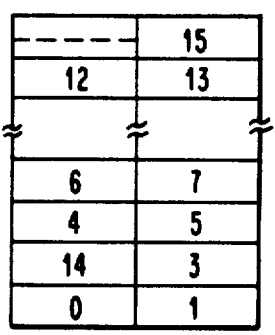

In the above example, it is assumed that the fault occurring in controller #2 only rendered the lower two daughter board pair unusable. Accordingly, the memory system can be reconfigured as shown in FIG. 8c as described above. From this point, the system can be reconfigured as shown in FIG. 8e. This involves moving off-line controller #2 to the position previously occupied by controller #14 and a half board swap. Accordingly, processing unit 40 issues a reconfiguration command whose command address bits are coded as follows:

bits 8–11 = 1110
bits 12–13 = 10
bit 15 = 1
bit 16 = 0
bit 17 = 1
bits 19–21 = 100.

The command is directed to controller #2. Therefore, command address bits 0–2 and 18 have the value 0010. The remaining address bits are binary ZEROS. Since controller #2 is "off-line", line BSYELO is forced to a binary ONE along with bus address bit BSAD06 while at the same time bus address bits BSAD26 and BSAD21 are forced to binary ZEROS. Again, line BSMREF is forced to a binary ONE.

As seen from FIG. 4e, since controller #2 is in an "off-line" state (i.e., signals OFFLN0010 and OFFLN010 are binary ONES), AND gate 211-30 forces signal MODOFL010 to a binary ONE. Signals BSYELO110 and BSAD06010 cause NAND gate 211-22 to force signal BSYEL6000 to a binary ZERO. Therefore, exclusive OR gate 211-34 forces signal OFFLIN000 to a binary ONE.

Since both signals BSAD03110 and BSAD04110 are binary ZEROS, NAND gates 211-24 and 211-26 force signals HOFLIN000 and QOFLIN000 to binary ONES. At this time, signal DBNOTH000 is a binary ONE (i.e., all daughter boards are installed). Therefore, NAND gate 211-28 forces signal RESPIN110 to a binary ZERO.

The circuit 216-160 of FIG. 4d in response to the reconfiguration command forces signal MYADG0100 to a binary ZERO. This causes AND gate 216-164 to force signal MYADG0001 to a binary ZERO. Since the other inputs to NOR gate 211-36 in response to signals RESPIN110 and MYADG0001 forces acknowledge signals ACKGEN010 to a binary ONE. The signal ACKGEN010 conditions bus response section 211 to generate memory acknowledge signal MYACKR010 in response to the memory reconfiguration command. This starts a memory cycle of operation during wich the timing circuits 204 of FIG. 4a generate a sequence of signals for read out of a single word from the memory location of controller #2 specified by address bits 3–22 of FIG. 5b in the manner previously described.

It will be noted that the new reconfiguration information stored in register 216-8 places controller #2 in the interleaved addressing mode operating at the address space originally provided by controller #14, swaps the pairs of daughter boards and resets off-line command bit 1. That is, reconfigure signals RCONF0010 through RCONF3010 stored in register 216-8 now pair controller #2 with controller #15 as shown in FIG. 8e. The swapping of the daughter board pairs as defined by signal HALFBS010 of register 216-8 positions the functional half of memory at the bottom as shown in FIG. 8e. Resetting signal OFFLN1010 to a binary ZERO now places the bottom half of memory on-line making it operational. Since signal OFFLN0010 is still a binary ONE, the top half of memory remains off-line and non-operational.

It will be appreciated from the foregoing that the system of FIG. 1 can be reconfigured again by processing unit 40 issuing reconfiguration commands. When it is desired to return all controllers to their original or initial states, this can be done by having processing unit 40 issue a default command wherein lines BSYELO and BSMREF in addition to bus address bits 7 and 19 are all set to binary ONES while bus address bits 20 and 21 are binary ZEROS. As seen from FIG. 4d, when signal BSAD07110 is a binary ONE, NAND gate 216-30 forces signal RCONCT110 to a binary ZERO. This causes the reconfiguration mode flip-flop 216-10 within each controller to be switched to a binary ZERO state in response to signal DCNR60110. This reverts control back to the set of switches 216-6 within each controller. Thus, each controller now responds to the controller address defined by switches S1–S4. Also, control reverts back to the controller's set of switches when there is a complete loss of power (i.e., when power on signal PWONLL010 is a binary ZERO).

Figure 9A:
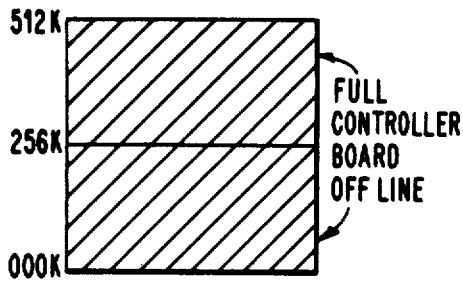
Figure 9B:
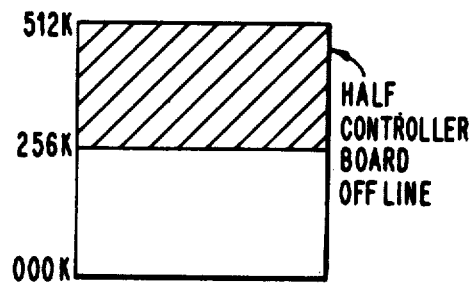
Figure 9C:
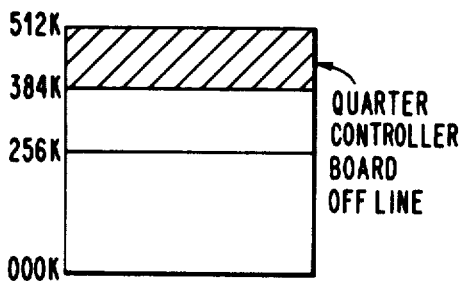

FIGS. 9a through 9c illustrate the different controller off-line memory configurations for a fully populated controller. As shown in FIG. 9a, an entire controller memory board can be placed off-line while in that state, the controller responds to off-line commands from processing unit 40. FIGS. 9b and 9c illustrate that half of the controller's memory board and a quarter of the controller's memory board can be placed off-line. However, the controller does not respond to off-line commands from processing unit 40 directed to the off-line portions of memory. That is, when a memory command is directed to the off-line half of memory, NAND gate 211-24 of FIG. 4e forces signal HOFLIN000 to a binary ZERO. This inhibits NOR gate 211-36 from responding to the memory request by forcing signal ACKGEN010 to a binary ZERO. In a similar manner, when a memory command is directed to the off-line quarter of memory, NAND gate 211-26 forces signal QOFLIN000 to a binary ZERO inhibiting the controller's response.

Figure 10A:
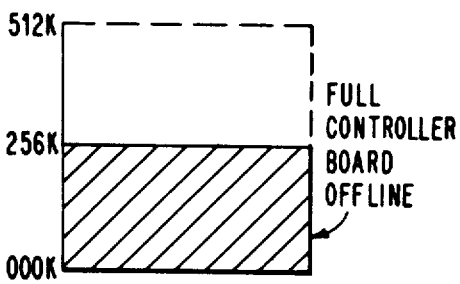
Figure 10B:
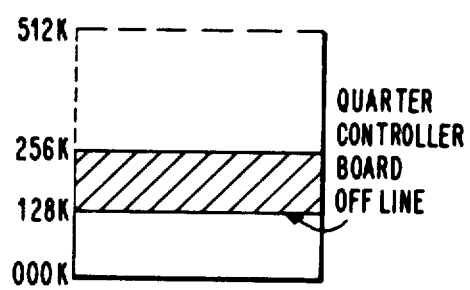

FIGS. 10a and 10b illustrate the different controller off-line memory configurations for a half populated controller. As seen from the Figures, a half populated controller responds only to commands which reconfigure full and quarter memory portions. That is, a command whose off-line bits specify placing off-line half the memory of a half populated controller will be ignored. More specifically, NAND gate 211-26 forces signal HOFLIN000 to a binary ZERO inhibiting the generation of bus response signal ACKGEN010.

From the above, it is seen how the arrangement of the present invention permits communication with controller memory portions which have been reconfigured to an off-line state.

The above has illustrated the manner in which a memory system including a number of memory controllers can be reconfigured by the apparatus of the present invention. It will be obvious to those skilled in the art that a controller can be reconfigured to operate in less than all of the modes defined by the reconfiguration apparatus invention. For example, in certain memory systems, off-line communications may not be required thereby eliminating the need for having the reconfiguration apparatus provide for this capability.

While in accordance with the provisions and statutes there has been illustrated and described the best form of the invention, certain changes may be made without departing from the spirit of the invention as set forth in the appended claims and that in some cases, certain features of the invention may be used to advantage without a corresponding use of other features.

What is claimed is:

1. A data processing system comprising a data processing unit and a memory system including a plurality of addressable memory controllers, each controller for controlling the operation of a memory including a plurality of memory modules included on a corresponding number of daughter boards in response to memory commands, said controllers being coupled in common to a bus for receiving said memory commands and data from said processing unit, each memory command including an address portion including a plurality of address bits coded to specify which one of said controllers is to perform the operation specified by said command and each memory controller including:

a reconfiguration control section coupled to said bus, said reconfiguration section for reconfiguring said controller within said system in response to memory commands, said section comprising:

register means for storing indications defining the type of controller memory reconfiguration in addition to controller address signals;

selectable switching means, said switching means defining the address of said controller within said memory system;

output selection means coupled to said register means and to said switching means, said output selection means for providing signals representative of said controller address during a reconfigured mode of operation; and, mode control means coupled to said bus and to said output selection means, said mode control means being switched to a predetermined state in response to a predetermined type of memory command defining a reconfiguration mode of operation for the controller specified by said command address portion, said mode control means when in said predetermined state conditioning said output selection means to apply said controller address signals from said register means as said signals representative of said controller address in lieu of said address from said switching means, enabling reconfiguration of said each memory controller of said plurality of memory controllers within said memory system as required for providing a contiguous addressable memory space.

2. The system of claim 1 wherein each predetermined type of memory command includes a diagnostic code defining said reconfiguration mode of operation and a reconfiguration bit pattern coded to contain said indications defining said type of controller memory reconfiguration, said reconfiguration section further including:

decode circuit means coupled to said bus, to said mode control means and to said register means, said decode circuit means being operative in response to said diagnostic code to generate an output signal for switching said mode control means to said predetermined state and for enabling said register means of the controller specified by said memory command address portion to be loaded with said reconfiguration bit pattern.

3. The system of claim 2 wherein each said controller further includes:

address compare means coupled to said output selection means and to said bus, said address compare means being operative to generate an output compare signal when said mode control means is in said predetermined state upon detecting an identical comparison between said signals representative of said controller address signals from said register means and said plurality of address bits of the memory command applied to said bus; and, bus response means coupled to said address compare means and to said bus, said bus response means being conditioned by said output compare signal to generate an acknowledgement signal on said bus indicating that said command has been accepted by said controller reconfigured to respond to said address from said register means by said predetermined type of command previously applied to said bus.

4. The system of claim 2 wherein ech of said controllers further includes addressing means coupled to said plurality of memory module units for generating signals for accessing different sections of sets of said memory daughter boards and wherein said register means includes a plurality of register stages, a number of said stages for storing predetermined bits of said reconfiguration bit pattern coded to specify said type of controller memory reconfiguration as a type of daughter board reconfiguration, said reconfiguration section further including:

logic means coupled to said number of said stages, to said addressing means and to bus for receiving predetermined address bits of said address portion of each memory command coded to specify access of said different sections, said logic means being conditioned by the states of said predetermined bits to alter the coding of said predetermined address bits for causing said addressing means to generate signals for accessing sections of sets of said memory daughter boards not specified by said coding of said predetermined address bits of said each memory command received by said controller following execution of said predetermined type of memory command.

5. The system of claim 4 wherein a first one of said number of stages stores a first predetermined bit of said reconfiguration bit pattern, said first predetermined bit being coded to specify whether or not pairs of said daughter boards are to be exchanged, said logic means being conditioned by a first state of said first predetermined bit to complement the state of a first one of said predetermined address bits for conditioning said addressing means to generate signals for accessing a pair of said daughter boards which is different from the pair specified by said state of said first one of said predetermined address bits.

6. The system of claim 5 wherein said first state of said first predetermined bit corresponds to a binary ONE state and said logic means includes a first exclusive or circuit for complementing said state of said first one of said predetermined address bits in response to said binary one state.

7. The system of claim 5 wherein a second one of said number of stages stores a second predetermined bit of said reconfiguration bit pattern, said second predetermined bit being coded to specify whether or not the halves of said pair of daughter boards are to be exchanged, said logic means being conditioned by a first state of said second predetermined bit to complement the state of a second one of said predetermined address bits for conditioning said addressing means to generate signals for accessing said halves of said pair of daughter boards which are different from the halves specified by said state of said second one of said predetermined address bits.

8. The system of claim 7 wherein said first state of said second predetermined bit corresponds to a binary ONE state and said logic means includes a second exclusive or circuit for complementing said state of said second one of said predetermined address bits in response to said binary ONE state.

9. The system of claim 3 wherein said register means includes a plurality of stages, a number of said stages for storing a plurality of bits of said reconfiguration bit pattern coded to specify the operational modes of different sections of said memory daughter boards, said bus response means including:

input logic means coupled to said number of said stages and to said bus for receiving certain ones of said address bits of said address portion therefrom, said input logic means combining said certain ones of said address bits with said plurality of bits of said reconfiguration bit pattern for generating signals indicating which sections of said memory daughter boards are in an off-line state; and, output gating means coupled to said input logic means and to said bus for generating said acknowledgement signal on said bus in accordance with the states of said signals.

10. The system of claim 9 wherein said input logic means includes:

first gating means coupled to said number of stages for generating a first output signal indicating when an entire daughter board memory of an addressed controller is in an off-line state;

second gating means coupled to said bus for receiving signals corresponding to a first predetermined one of said certain address bits specified by a diagnostic type of memory command, said second gating means generating a second output signal for indicating that said diagnostic command is for off-line controller communication; and, third gating means coupled to said first and second gating means and to said output gating means, said third gating means logically combining said first and second output signals to generate a third signal for enabling the generation of said acknowledgement signal permitting off-line communication with said off-line controller during diagnostic cycles of operation.

11. The system of claim 10 wherein said input logic means further includes fourth gating means coupled to said output gating means, said fourth gating means having a pair of input terminals, a first of said input terminals coupled to one of said number of stages for receiving a first signals indicating when at least half of said controller memory is an off-line state and a second of said input terminals being coupled to said bus for receiving a second signal corresponding to a second predetermined one of said address bits of said address portion indicating which half of said controller memory is being addressed, said fourth gating means logically combining said first and second signals for generating an output signal for inhibiting said output gating means from generating said acknowledgement signal preventing off-line communication with said half off-line controller.

12. The system of claim 9 wherein said input logic means further includes:

fifth gating means having a pair of input terminals and an output terminal, a first one of said pair of input terminals being coupled to a predetermined one of said daughter boards for receiving a third signal indicating when said predetermined one of said daughter boards has been installed in said controller and a second one of said pair of terminals being coupled to said bus for receiving a fourth signal corresponding to a third predetermined one of said address bits of said address portion indicating which half of said controller memory is being addressed;

sixth gating means having a plurality of input terminals and an output terminal connected to said output gating means, a first one of said input terminals being connected to said output terminal of said fifth gating means, a second terminal being coupled to another one of said number of stages for receiving a fifth signal indicating when a quarter of said controller memory is in an off-line state and a third one of said input terminals being coupled to said bus for receiving a third predetermined one of said certain address bits for indicating which quarter of said controller memory is being addressed, said sixth gating means logically combining the signal applied to said input terminals for generating an output signal for inhibiting said output gating means from generating said acknowledgement signal preventing off-line communication with said quarter of said controller memory.

13. The system of claim 10 wherein said first gating means includes an AND gate, said second gating means includes a NAND gate and said third gating means includes an exclusive OR gate.

14. The system of claim 11 wherein said fourth gating means includes a NAND gate.

15. The system of claim 12 wherein said fifth gating means includes an exclusive OR gate and said sixth gating means includes a NAND gate.

16. The system of claim 9 wherein said input logic means includes a multiplexer circuit having a pair of select input terminals, a plurality of data input terminals corresponding in number to the maximum number of daughter boards installable in each memory controller and an output terminal coupled to said output gating means, said pair of input terminals being coupled to said bus for receiving predetermined ones of said address bits of said portion specifying which one of said daughter boards is being addressed and each of said data input terminals being coupled to a different one of said maximum number of boards for receiving a signal indicating whether or not said different daughter board has been installed, said multiplexer circuit being operative in response to said predetermined ones of said address bits to apply said signal from the daughter board selected by said address bits to said output terminal for inhibiting said output gating means from generating said acknowledgement signal when said daughter board is not installed specifying that said controller is not fully populated.

17. The system of claim 4 wherein said register means includes a storage device for storing one of said indications received from said bus and applied as input to said storage device, said one indication defining the addressing mode of operation for said controller, said storage device further including a preset input terminal connected to receive a power-on signal for switching said storage device to a first state corresponding to a first addressing mode when said controller is powered on for operation and said reconfiguration control section further including:

a selection circuit having a plurality of output terminals coupled to said logic means and to said address selection means, a plurality of sets of input terminals, a first of said sets being coupled to said bus for receiving a first plurality if address bits of said address bits coded to specify a controller address when said system is being operated in said first addressing mode of operation and a second of said sets being coupled to said bus for receiving a second plurality of said address bits coded to specify said controller address when said system is being operated in a second addressing mode of operation and a control input terminal coupled to said storage device for receiving a signal representative of the state of said device, said storage device when in said first state conditioning said selection circuit to apply said first plurality of address bits to said output terminals conditioning said addressing means to operate in said first addressing mode and said storage device when switched to said second state in response to said predetermined type of memory command conditioning said selection circuit to apply said second plurality of address bits to said output terminals conditioning said addressing means to operate in said second addressing mode.

18. The system of claim 17 wherein said first state corresponds to a binary ONE state and said first addressing mode corresponds to an interleaved mode of operation and wherein said second state corresponds to a binary ZERO state and said second addressing mode corresponds to a banked mode of operation.

19. The system of claim 17 wherein said address compare means includes a plurality of compare circuits corresponding in number to said number of addressing modes of operation, each of said compare circuits having first and second sets of input terminals, said first set of input terminals of a first compare circuit being coupled to said bus for receiving a plurality of said address bits which are used to define a controller address when said system is being operated in said first mode of operation and said signal from said storage device and said second set of input terminals of said first compare circuit being coupled to said output selection means and to a voltage representative of a binary ONE, said first compare circuit being operative to generate said output compare signal upon detecting an identical comparison between said plurality of address bits and said controller address signals from said output selection means when said controller is being operated in said first addressing mode of operation.

20. The system of claim 19 wherein said first set of input terminals of a second compare circuit are coupled to said bus for receiving a plurality of said address bits which are used to define a controller address when said system is being operated in said second mode of operation and said signal from said storage device and said second set of input terminals of said second compare circuit being coupled to a ground reference voltage, said second compare circuit being operative to generate said output compare signal upon detectng an identical comparison between said plurality of address bits and said controller address signals from said output selection means when said controller is being operated in said second addressing mode of operation.

21. The system of claim 2 wherein said mode control means includes bistable storage means including a first input terminal coupled to receive said output signal from said decode circuit means, said bistable means being operative in response to said output signal to switch to a binary ONE state for conditioning said controller to operate in a reconfigured mode.

22. The system of claim 2 wherein said reconfiguration section of each controller further includes logic circuit means for generating a reconfiguration reset signal, said logic means being coupled to said bus for receiving signals representative of a diagnostic command and a predetermined one of said address bits for specifying when each of said plurality of controllers are to reset, said logic circuit means being operative in response to a predetermined state of said predetermined one of said address bits of a diagnostic memory command to switch said bistable storage means from said binary ONE state to a binary ZERO state thereby returning each controller under the control of said selectable switching means.

23. The system of claim 17 wherein said addressing means includes address decode circuit means coupled to said plurality of memory module units and to said logic means and wherein predetermined ones of said output terminals of said selection circuit are coupled to apply to said logic means, predetermined address bits of said first and second pluralities of said address bits during said first and second addressing modes respectively and said logic means applying said predetermined address bits altered in accordance with said states of said predetermined bits to said decode circuit means for conditioning said decode circuit means to generate signals for selecting sections of said memory module units designated for access during said reconfiguration mode of operation.

24. A memory system comprising a number of addressable memory controllers, each controller for controlling the operation of a memory including a plurality of memory modules included on a corresponding number of daughter boards and said controllers being coupled in common to a bus for receiving memory commands and data, each memory command including a multibit address portion having a plurality of address bits coded to specify which one of said controllers is to perform the operation specified by said command and said address portion of each predetermined type of command including a reconfiguration bit pattern coded to specify a number of different controller reconfiguration modes of operation, each memory controller including:

reconfiguration control means including register storage means for bit storing said reconfiguration bit pattern;

selectable switching means for generating a first set of signals defining the address of said controller within said memory system during normal operation;

address compare means coupled to said switching means, to said reconfiguration register storage means and to said bus, said address compare means being operative to generate an output compare signal during said normal operation upon detecting an identical comparison between said first set of signals and said plurality of address bits of said each predetermined type of memory command; and, response means coupled to said address compare means, to said register storage means and to said bus, said response means being conditioned by said output compare signal to generate an acknowledgement signal for enabling said reconfiguration bit pattern to be stored in said register storage means and different bits within said bit pattern conditioning said address compare means and said response means to generate in response to subsequently received memory commands, said output compare and said acknowledgement signals respectively in conformance with the coding of said different bits for operating said controller as reconfigured by said predetermined type of command.

25. The memory system of claim 24 wherein said reconfiguration control means further includes:

output selection means coupled to said register storage means for receiving signals corresponding to a plurality of bits of said reconfiguration bit pattern representative of the address of said controller as reconfigured by said predetermined type of command, and said output selection means being coupled to said switching means for receiving said first set of signals, said output selection means being operative to provide signals representative of a controller address; and, bistable mode control means coupled to said bus and to said output selection means, said mode control means being switched to a first state in response to said predetermined type of memory command defining a reconfiguration mode of operation for said controller, said mode control means when in said first state conditioning said output selection means to apply said controller address to said address compare means for comparison with said plurality of address bits of each subsequently received memory command, configuring said memory controller within said memory system for providing contiguous addressable memory space.

26. The memory system of claim 25 wherein each predetermined type of memory command includes a diagnostic code defining said reconfiguration mode of operation, said reconfiguration control means further including:

decode circuit means coupled to said bus, to said bistable mode control means and to said register storage means, said decode circuit means being operative in response to said diagnostic code to generate an output signal for switching said mode control means to said first state and for enabling said register storage means of the controller addressed by said each predetermined type of memory command to be loaded with said reconfiguration bit pattern.

27. The memory system of claim 25 wherein each of said controllers further includes addressing means coupled to said plurality of memory modules for generating signals for accessing different sections of pairs of said memory daughter boards and wherein said register storage means includes a plurality of register stages, a number of said stages for storing predetermined bits of said reconfiguration bit pattern coded to specify a type of daughter board reconfiguration, said reconfiguration control means further including:

a corresponding number of logic gating means each being coupled to different ones of said number of said stages, to said addressing means and to said bus for receiving predetermined address bits of said address portion of each memory command coded to specify access of said different sections, said number of logic gating means being conditioned by the states of said predetermined bits to alter the coding of said predetermined address bits for conditioning said addressing means to generate signals for accessing alternate sections of said pairs of said memory daughter boards which are specified by said coding of said predetermined address bits.

28. The memory system of claim 27 wherein a first one of said number of stages stores a first predetermined bit of said reconfiguration bit pattern, said first predetermined bit being coded to specify whether or not pairs of said daughter boards are to be exchanged, a first one of said number of logic gating means being conditioned by a first state of said first predetermined bit to complement the state of a first one of said predetermined bit to complement the state of a first one of said predetermined address bits for conditioning said addressing means to generate signals for accessing a pair of said daughter boards which is different from the pair specified by said state of said first one of said predetermined address bits.

29. The memory system of claim 28 wherein said first state of said first predetermined bit corresponds to a binary ONE state and said first one of said logic gating means includes a first exclusive or circuit for complementing said state of said first one of said predetermined address bits in response to said binary ONE state.

30. The memory system of claim 28 wherein a second one of said number of stages stores a second predetermined bit of said reconfiguration bit pattern, said second predetermined bit being coded to specify whether or not the halves of said pair of daughter boards are to be exchanged, a second one of said number of gating means being conditioned by a first state of said second predeterined bit to complement the state of a second one of said predetermined address bits for conditioning said addressing means to generate signals for accessing said halves of said pair of daughter boards which are different from the halves specified by said state of said second one of said predetermined address bits.

31. The memory system of claim 30 wherein said first state of said second predetermined bit corresponds to a binary ONE state and said logic means includes a second exclusive or circuit for complementing said state of said second one of said predetermined address bits in response to said binary ONE state.

32. The memory system of claim 26 wherein said register storage means includes a plurality of stages, a number of said stages for storing a plurality of bits of said reconfiguration bit pattern coded to specify the operational status of different sections of said memory, said bus response means including:
input logic means coupled to said number of said stages and to said bus for receiving certain ones of said address bits of said address portion therefrom, said input logic means combining said certain ones of said address bits with said plurality of bits of said reconfiguration bit pattern for generating signals indicating which sections of said memory are in an off-line state; and,
output gating means coupled to said input logic means and to said bus for generating said acknowledgement signal in accordance with the states of said signals.

33. The memory system of claim 32 wherein said input logic means includes:
first gating means coupled to said number of stages for generating a first output signal indicating when an entire daughter board memory of an addressed controller is in an off-line state;
second gating means coupled to said bus for receiving signals corresponding to a first predetermined one of said certain address bits specified by a diagnostic type of memory command, said second gating means generating a second output signal for indicating that said diagnostic command is for off-line controller communication; and,
third gating means coupled to said first and second gating means and to said output gating means, said third gating means logically combining said first and second output signals to generate a third signal for enabling the generating of said acknowledgement signal permitting off-line communication with said off-line controller during diagnostic cycles of operation.

34. The memory system of claim 33 wherein said input logic means further includes fourth gating means coupled to said output gating means, said fourth gating means having a pair of input terminals, a first of said input terminals coupled to one of said number of stages for receiving a first signal indicating when at least half of said controller memory is an off-line state and a second of said input terminals being coupled to said bus for receiving a second signal corresponding to a second predetermined one of said address bits of said address portion indicating which half of said controller memory is being addressed, said fourth gating means logically combining said first and second signals for generating an output signal for inhibiting said output gating means from generating said acknowledgement signal preventing off-line communication with said half off-line controller.

35. The memory system of claim 34 wherein said input logic means further includes:
fifth gating means having a pair of input terminals and an output terminal, a first one of said pair of input terminals being coupled to a predetermined one of said daughter boards for receiving a third signal indicating when said predetermined one of said daughter boards has been installed in said controller and a second one of said pair of terminals being coupled to said bus for receiving a fourth signal corresponding to a third predetermined one of said address bits of said address portion indicating which half of said controller memory is being addressed;
sixth gating means having a plurality of input terminals and an output terminal connected to said output gating means, a first one of said input terminals being connected to said output terminal of said fifth gating means, a second terminal being coupled to another one of said number of stages for receiving a fifth signal indicating when a quarter of said controller memory is in an off-line state and a third one of said input terminals being coupled to said bus for receiving a third predetermined one of said certain address bits for indicating which quarter of said controller memory is being addressed, said sixth gating means logically combining the signal applied to said input terminals for generating an output signal for inhibiting said output gating means from generating said acknowledgement signal preventing off-line communication with said quarter of said controller memory.

36. The system of claim 35 wherein said first gating means includes an AND gate, said second gating means includes a NAND gate, said third gating means includes an exclusive OR gate, said fourth gating means includes a NAND gate, said fifth gating means includes an exclusive OR gate and said sixth gating means includes a NAND gate.

37. The system of claim 32 wherein said input logic means includes a multiplexer circuit having a pair of select input terminals, a plurality of data input terminals corresponding in number to the maximum number of daughter boards installable in each memory controller and an output terminal coupled to said output gating means, said pair of input terminals being coupled to said bus for receiving predetermined ones of said address bits of said portion specifying which one of said daughter boards is being addressed and each of said data input terminals being coupled to a different one of said maximum number of boards for receiving a signal indicating whether or not said different daughter board has been installed, said multiplexer circuit being operative in response to said predetermined ones of said address bits to apply said signal from the daughter board selected by said address bits to said output terminal for inhibiting said output gating means from generating said acknowledgement signal when said daughter board is not installed specifying that said controller is not fully populated.

38. A memory system comprising n number of addressable memory controllers, each controller for controlling the operation of a memory including a plurality of memory modules included on a corresponding number of daughter boards and said controllers being coupled in common to a bus for receiving memory commands and data, each memory command including a multibit address portion having a plurality of address bits coded to specify which one of said controllers is to perform the operation specified by said command and said address portion of each predetermined type of command including a reconfiguration bit pattern coded to specify a number of different reconfiguration modes of operation, said each memory controller including:

a set of manually selectable switches for generating a first set of signals definig the address of said controller within said memory system during normal operation;

reconfiguration control section means including a register for storing said reconfiguration bit pattern including controller address signals;

an output selection circuit coupled to said register and to said set of switches, said output selection circuit providing signals representative of said address; and, bistable mode control means coupled to said bus and to said output selection means, said mode control means being switched to a first state in response to a predetermined type of memory command coded for defining a reconfiguration mode of operation for said controller associated therewith;

address compare circuit means coupled to said switches, to said reconfiguration register and to said bus, said address compare circuit means being operative to generate an output compare signal when said mode control circuit is in a second state indicative of said normal operation upon detecting an identical comparison between said first set of signals and said plurality of address bits of said each predetermined type of memory command; and, bus response means coupled to said address compare circuit means, to said reconfiguration register and to said bus, said response means being conditioned by said output compare signal to generate an acknowledgement signal for enabling said reconfiguration bit pattern to be stored in said reconfiguration register and different bits within said bit pattern conditioning said address compare circuit means and bus response means to generate said compare and said acknowledgement signals respectively upon detecting an identical comparison betwen said controller address signals and said plurality of address bits of each subsequent command when said bistable mode control circuit is in said first state thereby enabling different ones of said n number of controllers to be reconfigured to provide the necessary addressable memory space for memory system operation.

39. The memory system of claim 38 wherein each predetermined type of memory command includes a diagnostic code, said reconfiguration section further including:

a decoder circuit coupled to said bus, to said mode control means and to said register, said decoder circuit being operative in response to said diagnostic code specifying said reconfiguration mode of operation to generate an output signal for switching said mode control means to said first state and for enabling said register of the addressed controller to be loaded with said reconfiguration bit pattern.

40. The memory system of claim 39 wherein each of said controllers further includes addressing means coupled to said plurality of memory modules for generating signals for accessing different sections of pairs of said memory daughter boards and wherein said register includes a plurality of register stages, a number of said stages for storing predetermined bits of said reconfiguration bit pattern coded to specify the type of daughter board reconfiguration, said reconfiguration section further including:

a number of logic gates coupled to said number of said stages, to said addressing means and to bus for receiving predetermined address bits of said address portion of each memory command coded to specify access of said different sections, each of said number of logic circuits being conditioned by the states of different ones of said predetermined bits to alter the coding of one of said predetermined address bits for conditioning said addressing sections of said pairs of memory daughter boards which are not specified by said coding of said one predetermined address bit.

41. The memory system of claim 40 wherein a first one of said number of stages stores a first predetermined bit of said reconfiguration bit pattern, said first predetermined bit being coded to specify whether or not pairs of said daughter boards are to be exchanged, a first one of said logic gates being conditioned by a first state of said first predetermined bit to complement the state of a first one of said predetermined address bits for conditioning said addressing means to generate signals for accessing a pair of said daughter boards which is different from the pair specified by said state of said first one of said predetermined address bits.

42. The memory system of claim 40 wherein a second one of said number of stages stores a second predetermined bit of said reconfiguration bit pattern, said second predetermined bit being coded so specify whether or not the halves of said pair of daughter boards are to be exchanged, a second one of said logic gates being conditioned by a first stage of said second predetermined bit to complement the state of a second one of said predetermined address bits for conditioning said addressing means to generate signals for accessing said halves of said pair of daughter boards which are different from the halves specified by said state of said second one of said predetermined address bits.

43. The memory system of claim 40 wherein said register includes a plurality of stages, a number of said stages for storing a plurality of bits of said reconfiguration bit pattern coded to specify the off-line operational modes of different sections of said memory daughter boards, said bus response means including:

input logic means coupled to said number of said stages and to said bus for receiving certain ones of said address bits of said address portion therefrom, said input logic means combining said certain ones of said address bits with said plurality of bits of said reconfiguration bit pattern for generating signals indicating which sections of said controller memory are in an off-line state; and, output gating means coupled to said input logic means and to said bus for generating said acknowledgement signal in accordance with the states of said signals.

44. The system of claim 43 wherein said input logic means includes a multiplexer circuit having a pair of select input terminals, a plurality of data input terminals corresponding in number to the maximum number of daughter boards installable in each memory controller and an output terminal coupled to said output gating means, said pair of input terminals being coupled to said bus for receiving predetermined ones is being addressed and each of said data input terminals being coupled to a different one of said maximum number of boards for receiving a signal indicating whether or not said different daughter board has been installed, said multiplexer circuit being operative in response to said predetermined ones of said address bits to apply said signal from the daughter board selected by said address bits to said output terminal for inhibiting said output gating means from generating said acknowledgement signal when said daughter board is not installed specifying that said controller is not fully populated.

45. The system of claim 42 wherein a third one of said number of stages stores a third predetermined bit of said reconfiguration bit pattern, said third predetermined bit defining the address mode of operation for said controller, said third one of said stages further including a preset input terminal connected to receive a power-on signal for switching said stage to a first state corresponding to a first address mode when said controller is powered on for operation and said reconfiguration control section further including:

a selection circuit having a plurality of output terminals coupled to a different one of said number of logic gates and to said addressing means, a plurality of sets of input terminals, a first of said sets being coupled to said bus for receiving a first plurality of address bits of said address bits coded to specify a controller address when said system is being operated in a first addressing mode of operation and a second of said sets being coupled to said bus for receiving a second plurality of said address bits coded to specify said controller address when said system is being operated in a second addressing mode of operation and a control input terminal coupled to said third one of said stages for receiving a signal representative of the state of said stage, said stage when in said first state conditioning said selection circuit to apply said first plurality of address bits to said output terminals conditioning said addressing means to operate in said first address mode and said third one of said stages when switched to said second state in response to said predetermined type of memory command conditioning said selection circuit to apply said second plurality of address bits to said output terminals conditioning said addressing means to operate in said second addressing mode.

46. The system of claim 45 wherein said first state corresponds to a binary ONE state and said first addressing mode corresponds to an interleaved mode of operation and wherein said second state corresponds to a binary ZERO state and said second addressing mode corresponds to a banked mode of operation.

* * * * *